US012710802B2

(12) United States Patent
Kurokawa et al.

(10) Patent No.: US 12,710,802 B2
(45) Date of Patent: Aug. 18, 2026

(54) SEMICONDUCTOR DEVICE

(71) Applicant: Semiconductor Energy Laboratory Co., Ltd., Atsugi (JP)

(72) Inventors: Yoshiyuki Kurokawa, Sagamihara (JP); Masashi Fujita, Fuchu (JP); Kazuaki Ohshima, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 100 days.

(21) Appl. No.: 18/716,284

(22) PCT Filed: Dec. 8, 2022

(86) PCT No.: PCT/IB2022/061918
§ 371 (c)(1),
(2) Date: Jun. 4, 2024

(87) PCT Pub. No.: WO2023/119039
PCT Pub. Date: Jun. 29, 2023

(65) Prior Publication Data

US 2025/0028379 A1 Jan. 23, 2025

(30) Foreign Application Priority Data

Dec. 22, 2021 (JP) ................................ 2021-208137

(51) Int. Cl.
*G11C 11/00* (2006.01)
*G06F 1/3287* (2019.01)
(Continued)

(52) U.S. Cl.
CPC ........ *G06F 1/3287* (2013.01); *G11C 11/4074* (2013.01); *G11C 11/4096* (2013.01); *H10D 30/6755* (2025.01)

(58) Field of Classification Search
CPC .............. G06F 1/3287; H10D 30/6755; G11C 11/4076; G11C 11/4096
See application file for complete search history.

(56) References Cited

U.S. PATENT DOCUMENTS 7,584,321 B1 * 9/2009 Malachowsky ........ G09G 5/395 711/5
9,501,432 B2 * 11/2016 Cordero .............. G06F 12/0246
(Continued)

FOREIGN PATENT DOCUMENTS

JP 2005-276117 A 10/2005
JP 2011-151383 A 8/2011
(Continued)

OTHER PUBLICATIONS

International Search Report (Application No. PCT/IB2022/061918) Dated Feb. 28, 2023.
(Continued)

*Primary Examiner* — Pho M Luu
(74) *Attorney, Agent, or Firm* — Eric J. Robinson; Robinson Intellectual Property Law Office, P.C.

(57) ABSTRACT

A novel semiconductor is provided. The semiconductor includes a first component, a second component, and an instruction portion. The first component includes a first memory circuit having a function of storing first setting information in a state where power is supplied, and a second memory circuit having a function of storing the first setting information in a state where power is not supplied. The second component includes a third memory circuit having a function of storing second setting information in a state where power is supplied, and a fourth memory circuit having a function of storing the second setting information in a state where power is not supplied. The instruction portion has a function of controlling whether power is supplied to each of the first component and the second component. Each of the
(Continued)

second memory circuit and the fourth memory circuit includes a transistor including a metal oxide in a semiconductor layer where a channel is formed.

11 Claims, 13 Drawing Sheets

(51) Int. Cl.

| | |
|---|---|
| ***G11C 11/4074*** | (2006.01) |
| ***G11C 11/4096*** | (2006.01) |
| ***H10D 30/67*** | (2025.01) |

(56) References Cited

U.S. PATENT DOCUMENTS

| | | | | |
|---|---|---|---|---|
| 9,804,645 | B2 | 10/2017 | Koyama et al. | |
| 11,209,880 | B2 | 12/2021 | Koyama et al. | |
| 11,934,243 | B2 | 3/2024 | Koyama et al. | |
| 2007/0273353 | A1* | 11/2007 | Okamoto | G01R 31/3004 323/324 |
| 2011/0156027 | A1 | 6/2011 | Yamazaki et al. | |
| 2012/0032730 | A1 | 2/2012 | Koyama | |
| 2013/0191673 | A1 | 7/2013 | Koyama et al. | |
| 2013/0241286 | A1 | 9/2013 | Yamazaki | |
| 2014/0244949 | A1* | 8/2014 | Abali | G06F 11/1484 711/162 |
| 2017/0300261 | A1 | 10/2017 | Kurokawa | |
| 2021/0295780 | A1 | 9/2021 | Ikeda. et al. | |
| 2022/0254401 | A1 | 8/2022 | Kurokawa. et al. | |

FOREIGN PATENT DOCUMENTS

| | | | |
|---|---|---|---|
| JP | 2012-257187 | A | 12/2012 |
| JP | 2013-219759 | A | 10/2013 |
| JP | 2013-251884 | A | 12/2013 |
| JP | 2017-194680 | A | 10/2017 |
| KR | 2014-0124795 | A | 10/2014 |
| WO | WO-2013/111757 | | 8/2013 |
| WO | WO-2019/220278 | | 11/2019 |
| WO | WO-2023/111763 | | 6/2023 |

OTHER PUBLICATIONS

Written Opinion (Application No. PCT/IB2022/061918) Dated Feb. 28, 2023.

* cited by examiner

FIG. 5A
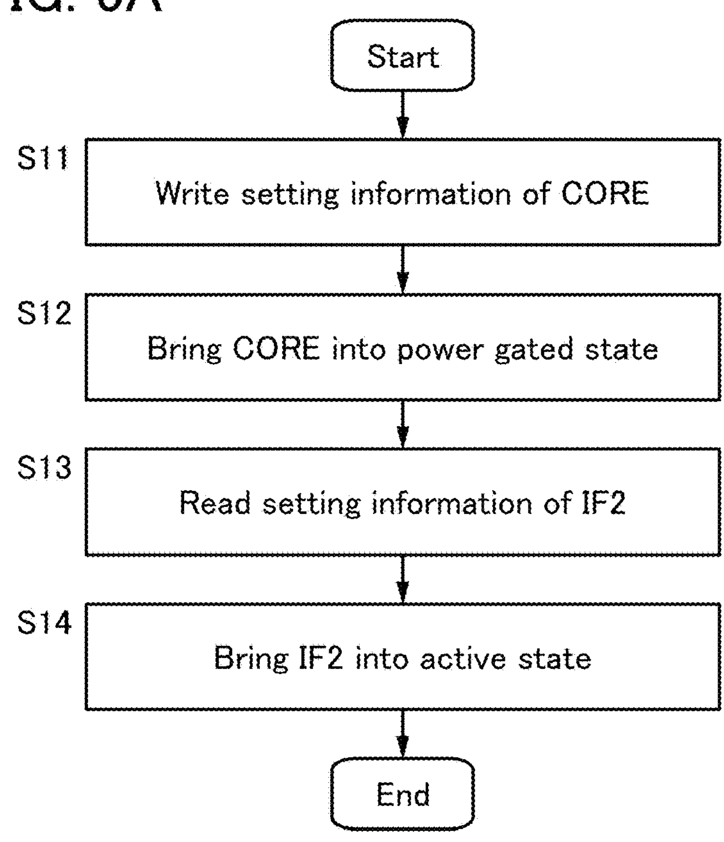
FIG. 5B
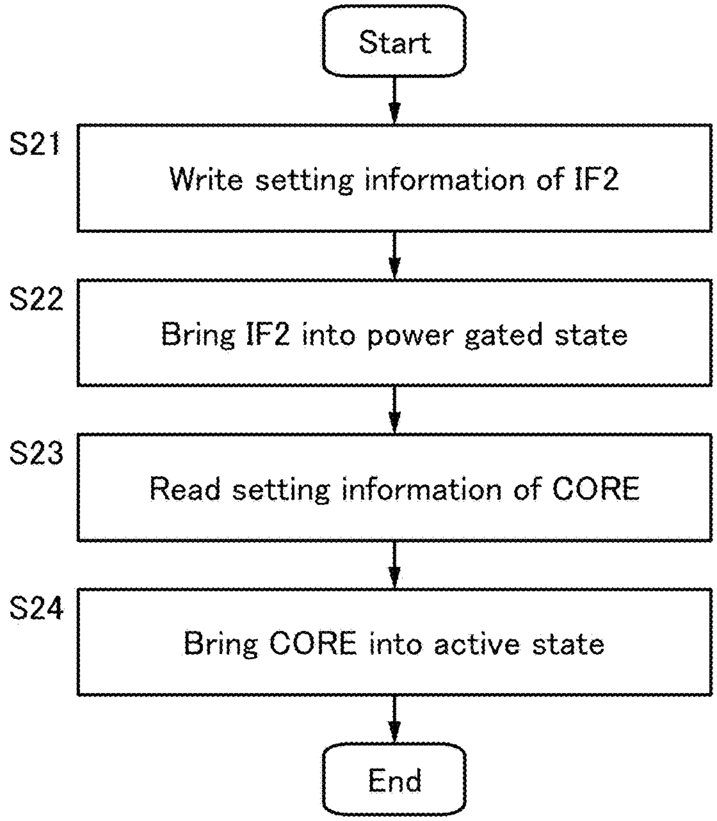

FIG. 11A
FIG. 11B
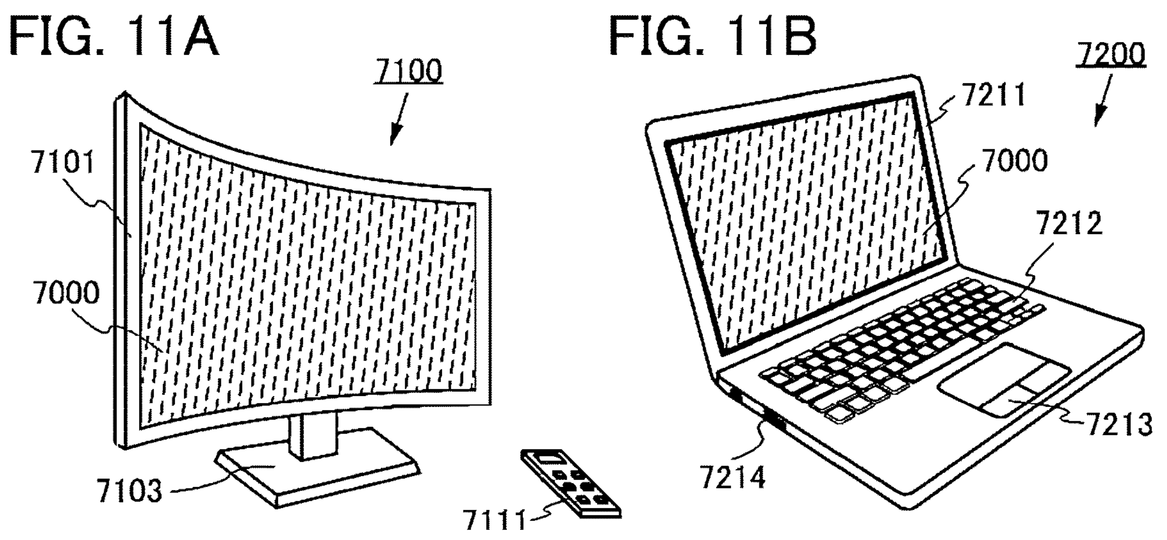
FIG. 11C
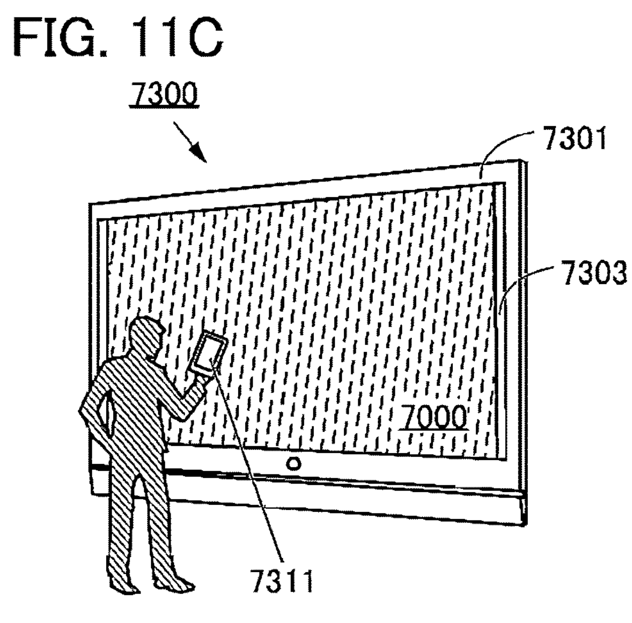
FIG. 11D
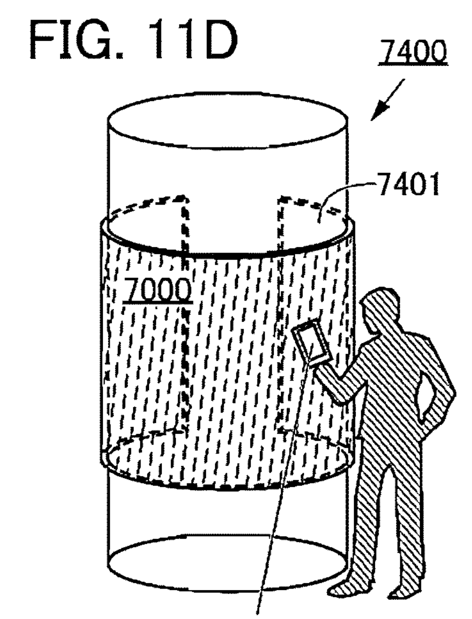
FIG. 11E
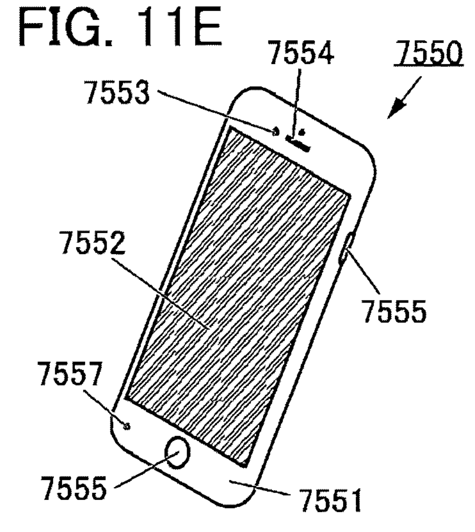
FIG. 11F
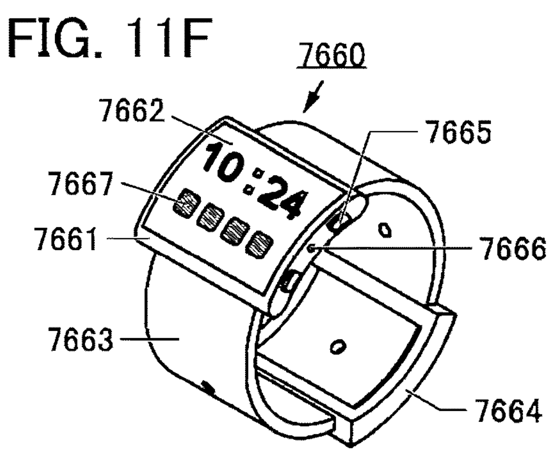

SEMICONDUCTOR DEVICE

TECHNICAL FIELD

One embodiment of the present invention relates to a semiconductor device. In particular, one embodiment of the present invention relates to a semiconductor device including a memory device. In particular, one embodiment of the present invention relates to a semiconductor device including a nonvolatile memory device.

Note that one embodiment of the present invention is not limited to the above technical field. The technical field of one embodiment of the invention disclosed in this specification and the like relates to an object, a method, a driving method, or a manufacturing method. Alternatively, one embodiment of the present invention relates to a process, a machine, manufacture, or a composition of matter. Thus, specific examples of the technical field of one embodiment of the present invention disclosed in this specification and the like include a semiconductor device, a display apparatus, a light-emitting apparatus, a power storage device, an optical device, an imaging device, a lighting device, an arithmetic device, a control device, a memory device, an input device, an output device, an input/output device, a signal processing device, an electronic computer, an electronic device, driving methods thereof, and a manufacturing methods thereof.

BACKGROUND ART

A CPU (Central Processing Unit), an MPU (Micro Processing Unit), an MCU (Micro Controller Unit), or the like performs series of processes by successively executing processing corresponding to a program (data) stored in a program memory. Data necessary for the processing or data obtained by the processing is received from a peripheral circuit or transmitted to the peripheral circuit. A variety of peripheral circuits are used in accordance with demands of users. Examples of the peripheral circuit include a DRAM (Dynamic Random Access Memory) interface, a PCI (Peripheral Component Interface), a DMA (Direct Memory Access), a network interface, and an audio interface.

It is known that a transistor using an oxide semiconductor has an extremely low leakage current in a non-conduction state. For example, Patent Document 1 discloses a low-power-consumption CPU utilizing a feature of a low leakage current of a transistor using an oxide semiconductor. Furthermore, for example, Patent Document 2 discloses a memory device that can continuously retain stored contents for a long time by utilizing a feature of a low leakage current of a transistor using an oxide semiconductor.

Patent Document 3 discloses a high-resolution display apparatus with a large number of pixels including light-emitting devices containing organic EL.

REFERENCE

Patent Documents

[Patent Document 1] Japanese Published Patent Application No. 2012-257187

[Patent Document 2] Japanese Published Patent Application No. 2011-151383

[Patent Document 3] PCT International Publication No. 2019/220278

SUMMARY OF THE INVENTION

Problems to be Solved by the Invention

When data is transmitted and received from a specific peripheral circuit in processing of a CPU, another peripheral circuit that does not contribute to the processing is in an idle state. Thus, power gating for stopping power supply to another peripheral circuit that does not contribute to the processing is performed, whereby power consumption can be reduced. However, in order to utilize a peripheral circuit, various kinds of settings are required to be made and setting information is required to be stored in a setting register provided in the peripheral circuit. Thus, when the peripheral circuit is wakes up from a power gated state, the setting information is required to be stored in the setting register again. Such operation leads to energy loss when power gating is executed, whereby an effect of reducing power consumption is lowered even when power gating is performed.

An object of one embodiment of the present invention is to provide a semiconductor device with low power consumption. Another object of one embodiment of the present invention is to provide a semiconductor device that operates at high speed. Another object of one embodiment of the present invention is to provide a small semiconductor device. Another object of one embodiment of the present invention is to provide a highly reliable semiconductor device. Another object of one embodiment of the present invention is to provide a novel semiconductor device.

Means for Solving the Problems

The present invention has been made in view of the above objects, and in the semiconductor device, a register of a CPU and the setting register of the peripheral circuit are each formed with a nonvolatile register (a register including a memory circuit for continuously storing data even in a power gated state), and a function of individually performing power gating for each block (each CPU and peripheral circuit) is incorporated. In each block, when data is stored in the nonvolatile register in a power gated state, processing can be restarted from the state where the data in the register is set after waking up from a power gated state. The semiconductor device is provided with a function of power gating blocks that do not contribute to the processing, in accordance with the processing of the semiconductor device. With such a structure, it is possible to reduce power consumption of blocks other than those contributing to the actual processing of the semiconductor device, whereby a semiconductor device that can reduce power consumption during operation can be provided.

(1)

One embodiment of the present invention is a semiconductor device including a first component, a second component, and an instruction portion. The first component includes a first memory circuit having a function of storing first setting information in a state where power is supplied, and a second memory circuit having a function of storing the first setting information in a state where power is not supplied. The second component includes a third memory circuit having a function of storing second setting information in a state where power is supplied, and a fourth memory circuit having a function of storing the second setting information in a state where power is not supplied. The instruction portion has a function of controlling whether power is supplied to each of the first component and the second component. The first component has a function of writing the first setting information stored in the first memory circuit to the second memory circuit and being brought into a state where power is not supplied, and a function of storing the first setting information read from the second memory circuit in the first memory circuit and being brought into a state where power is supplied. The second component has a function of writing the second setting information stored in the third memory circuit to the fourth memory circuit and being brought into a state where power is not supplied, and a function of storing the second setting information read from the fourth memory circuit in the third memory circuit and being brought into a state where power is supplied. Each of the second memory circuit and the fourth memory circuit includes a transistor including a metal oxide in a semiconductor layer where a channel is formed.

(2)

In (1) above, each of the second memory circuit and the fourth memory circuit can include a first transistor and a capacitor. One of a source and a drain of the first transistor can be electrically connected to one electrode of the capacitor. The first transistor can have a function of being brought into a non-conduction state in a state where power is not supplied. The capacitor can have a function of retaining charge of the one electrode of the capacitor when the first transistor is brought into a non-conduction state. The first transistor can include a metal oxide in a semiconductor layer where a channel is formed.

(3)

In (1) above, each of the second memory circuit and the fourth memory circuit can include a first transistor and a second transistor. One of a source and a drain of the first transistor can be electrically connected to a gate of the second transistor. The first transistor can have a function of being brought into a non-conduction state in a state where power is not supplied. The second transistor can have a function of retaining charge of the gate of the second transistor when the first transistor is brought into a non-conduction state. The first transistor can include a metal oxide in a semiconductor layer where a channel is formed.

(4)

One embodiment of the present invention includes a processor core, an interface, an instruction portion. The processor core includes a first register having a function of storing first setting information in a state where power is supplied, and a first memory having a function of storing the first setting information in a state where power is not supplied. The interface includes a second register having a function of storing second setting information in a state where power is supplied, and a second memory having a function of storing the second setting information in a state where power is not supplied. The instruction portion has a function of controlling whether power is supplied to each of the processor core and the interface. The processor core has a function of writing the first setting information stored in the first register to the first memory and being brought into a state where power is not supplied, and a function of storing the first setting information read from the first memory in the first register and being brought into a state where power is supplied. The interface has a function of writing the second setting information stored in the second register to the second memory and being brought into a state where power is not supplied, and a function of storing the second setting information read from the second memory in the second register and being brought into a state where power is supplied. Each of the first memory circuit and the second memory circuit includes a transistor including a metal oxide in a semiconductor layer where a channel is formed.

(5)

In (4) above, each of the first memory and the second memory can include a first transistor and a capacitor. One of a source and a drain of the first transistor can be electrically connected to one electrode of the capacitor. The first transistor can have a function of being brought into o a non-conduction state in a state where power is not supplied. The capacitor can have a function of retaining charge of the one electrode of the capacitor when the first transistor is brought into a non-conduction state. The first transistor can include a metal oxide in a semiconductor layer where a channel is formed.

(6)

In (4) above, each of the first memory and the second memory can include a first transistor and a second transistor. One of a source and a drain of the first transistor can be electrically connected to a gate of the second transistor. The first transistor can have a function of being brought into a non-conduction state in a state where power is not supplied. The second transistor can have a function of retaining charge of the gate of the second transistor when the first transistor is brought into a non-conduction state. The first transistor can include a metal oxide in a semiconductor layer where a channel is formed.

Effect of the Invention

One embodiment of the present invention can provide a semiconductor device with low power consumption. Another object of one embodiment of the present invention can provide a semiconductor device that operates at high speed. Another embodiment of the present invention can provide a small semiconductor device. Another embodiment of the present invention can provide a highly reliable semiconductor device. Another embodiment of the present invention can provide a novel semiconductor device.

BRIEF DESCRIPTION OF THE DRAWINGS

FIG. 5A and FIG. 5B are flow charts each showing an operation example of a semiconductor device.

FIG. 11A to FIG. 11F are diagrams each illustrating an example of an electronic device.

MODE FOR CARRYING OUT THE INVENTION

Figure 1:
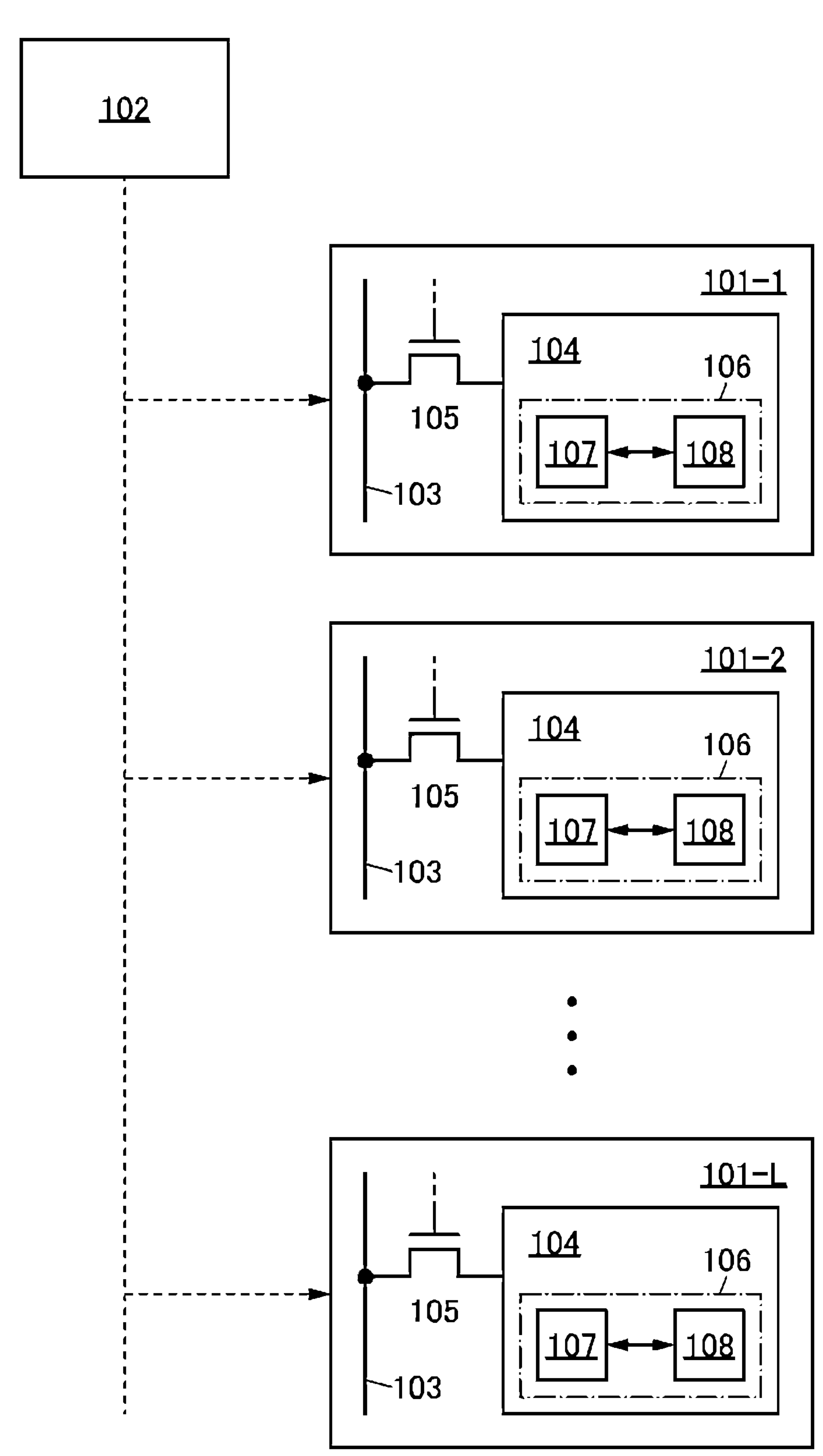
FIG. 1 is a diagram illustrating a structure example of a semiconductor device.

In this specification and the like, a semiconductor device refers to a device that utilizes semiconductor characteristics, and means a circuit including a semiconductor element (e.g., a transistor, a diode, or a photodiode) or a device including the circuit, for example. The semiconductor device also means all devices that can function by utilizing semiconductor characteristics. For example, an integrated circuit, a chip including an integrated circuit, and an electronic component including a chip in a package are examples of the semiconductor device. Moreover, for example, a memory device, a display apparatus, a light-emitting apparatus, a lighting device, an electronic device, and the like themselves may be semiconductor devices and may each include a semiconductor device.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, e.g., a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, or a load) can be connected between X and Y.

For example, in the case where X and Y are functionally connected, one or more circuits that allow functional connection between X and Y (e.g., a logic circuit (e.g., an inverter, a NAND circuit, or a NOR circuit); a signal converter circuit (e.g., a digital-analog converter circuit, an analog-digital converter circuit, or a gamma correction circuit); a potential level converter circuit (e.g., a power supply circuit (e.g., a step-up circuit and a step-down circuit) or a level shifter circuit for changing the potential level of a signal); a voltage source; a current source; a switch circuit; an amplifier circuit (e.g., a circuit that can increase signal amplitude, the current amount, or the like, an operational amplifier, a differential amplifier circuit, a source follower circuit, or a buffer circuit); a signal generation circuit; a memory circuit; or a control circuit) can be connected between X and Y. For instance, even if another circuit is interposed between X and Y, X and Y are regarded as being functionally connected when a signal output from X is transmitted to Y.

Note that an explicit description that X and Y are electrically connected includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed that, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed that "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed that "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: the wiring and the electrode. Thus, electrical connection in this specification and the like includes, in its category, such a case where one conductive film has functions of a plurality of components.

In this specification and the like, as a "resistor", a circuit element, a wiring, or the like having a resistance value higher than 0Ω can be used, for example. Accordingly, in this specification and the like, examples of the "resistor" include a wiring having a resistance value, a transistor in which current flows between its source and drain, a diode, and a coil. Thus, the term "resistor" can be replaced with the terms "resistance", "load", "region having a resistance value", or the like. Conversely, the terms "resistance", "load", and "region having a resistance value" can be replaced with the term "resistor", or the like. The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance value may be higher than or equal to 1Ω and lower than or equal to $1'10^{9}\Omega$.

In the case where a wiring is used as a resistor, the resistance value of the resistor is sometimes determined depending on the length of the wiring. Alternatively, a conductor with resistivity different from that of a conductor used as a wiring is sometimes used as a resistor. Alternatively, in the case where a semiconductor is used as a resistor, the resistance value of the resistor is sometimes determined by doping a semiconductor with an impurity.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Thus, in this specification and the like, a “capacitor” is not limited to only a circuit element that has a pair of electrodes and a dielectric between the electrodes. A “capacitor” includes, for example, parasitic capacitance generated between wirings, gate capacitance generated between a gate and one of a source and a drain of a transistor, and the like. The term “capacitor”, “parasitic capacitance”, “gate capacitance”, or the like can be replaced with the term “capacitance” and the like, for example. Conversely, the term “capacitance” can be replaced with the term “capacitor”, “parasitic capacitance”, “gate capacitance”, or the like, for example. The term “a pair of electrodes” of a “capacitor” can be replaced with “a pair of conductors”, “a pair of conductive regions”, “a pair of regions”, or the like, for example. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In this specification and the like, a transistor includes three terminals called a gate, a source, and a drain. The gate is a control terminal for controlling the amount of current flowing between the source and the drain. Two terminals functioning as the source and the drain are input/output terminals of the transistor. One of the two input/output terminals serves as the source and the other serves as the drain depending on the conductivity type (n-channel type or p-channel type) of the transistor and the levels of potentials supplied to the three terminals of the transistor. Thus, the terms “source” and “drain” can be replaced with each other in this specification and the like. Furthermore, in this specification and the like, expressions “one of a source and a drain” (or a first electrode or a first terminal) and “the other of the source and the drain” (or a second electrode or a second terminal) are used in the description of the connection relationship of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms “gate” and “back gate” can be replaced with each other in one transistor in some cases. In the case where a transistor includes three or more gates, each of the gates may be referred to as a first gate, a second gate, or a third gate, for example, in this specification and the like.

In this specification and the like, a “node” can be referred to as a “terminal”, a “wiring”, an “electrode”, a “conductive layer”, a “conductor”, an “impurity region”, or the like depending on the circuit structure, the device structure, or the like, for example. Furthermore, a “terminal”, a “wiring”, or the like can be referred to as a “node”, for example.

In this specification and the like, “voltage” and “potential” can be replaced with each other as appropriate. “Voltage” refers to a potential difference from a reference potential, and when the reference potential is a ground potential, for example, “voltage” can be replaced with “potential”. Note that the ground potential does not necessarily mean 0 V. Note that a potential is relative. Moreover, potentials are relative values. That is, a potential supplied to a wiring, a potential applied to a circuit and the like, or a potential output from a circuit and the like, are changed with a change of the reference potential.

In this specification and the like, the terms “high-level potential” (also referred to as “H potential” or “H”) and “low-level potential” (also referred to as “L potential” or “L”) do not mean a particular potential. For example, in the case where two wirings are both described as “functioning as a wiring for supplying a high-level potential”, the levels of the high-level potentials supplied from the wirings are not necessarily equal to each other. Similarly, in the case where two wirings are both described as “functioning as a wiring for supplying a low-level potential”, the levels of the low-level potentials supplied from the wirings are not necessarily equal to each other.

In this specification and the like, “current” means a charge transfer (electrical conduction). For example, the description “electrical conduction of positively charged particles occurs” can be rephrased as “electrical conduction of negatively charged particles occurs in the opposite direction”. Thus, unless otherwise specified, “current” in this specification and the like refers to a charge transfer phenomenon (electrical conduction) accompanied by carrier movement. Examples of a carrier here include an electron, a hole, an anion, a cation, and a complex ion. The type of carrier differs depending on current-flowing systems (e.g., a semiconductor, a metal, an electrolyte solution, or a vacuum). For example, the “direction of current” in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of current (or the direction of current) is not specified in this specification and the like, the description “current flows from element A to element B” can be rephrased as “current flows from element B to element A” and the like, for example. The description “current is input to element A” and the like can be rephrased as “current is output from element A” and the like, for example.

Ordinal numbers such as “first”, “second”, and “third” in this specification and the like are used to avoid confusion among components. Thus, the ordinal numbers do not limit the number of components. In addition, the ordinal numbers do not limit the order of components. For example, a “first” component in one embodiment in this specification and the like can be referred to as a “second” component in other embodiments, the scope of claims, or the like. Furthermore, for example, a “first” component in one embodiment in this specification and the like can be omitted in other embodiments, the scope of claims, or the like.

In this specification and the like, for example, terms for describing arrangement, such as “over”, “under”, “above”, and “below” are sometimes used for convenience to describe the positional relationship between components with reference to drawings. The positional relationship between components is changed as appropriate in accordance with a direction in which each component is described. Thus, the terms for describing arrangement in this specification and the like are not limited to those and can be replaced with another term as appropriate depending on the situation. For example, the expression “an insulator positioned over (on) a top surface of a conductor” can be replaced with the expression “an insulator positioned under (on) a bottom surface of a conductor” when the direction of a drawing illustrating these components is rotated by 180°. Moreover, the expression “an insulator located over (on) a top surface of a conductor” can be replaced with the expression “an insulator located on a left surface (or a right surface) of a conductor” when the direction of a drawing showing these components is rotated by 90°.

The term “over” or “under” does not necessarily mean that a component is placed directly over or directly under and directly in contact with another component. For example, the expression “electrode B over insulating layer A" does not necessarily mean that the electrode B is formed over and in direct contact with the insulating layer A, and does not exclude the case where another component is provided between the insulating layer A and the electrode B.

Furthermore, the term "overlap", for example, in this specification and the like does not limit a state such as the stacking order of components. For example, the expression "electrode B overlapping with insulating layer A" does not necessarily mean the state where the electrode B is formed over the insulating layer A. The expression "electrode B overlapping with insulating layer A", for example, does not exclude the state where the electrode B is formed under the insulating layer A and the state where the electrode B is formed on the right side (or the left side) of the insulating layer A.

The term "adjacent" or "proximity" in this specification and the like does not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

In this specification and the like, the term "film", "layer", or the like can be, for example, interchanged with each other depending on the situation, in some cases. For example, the term "conductive layer" can be changed into the term "conductive film" in some cases. For another example, the term "insulating film" can be changed into the term "insulating layer" in some cases. Alternatively, for example, the term "film", "layer", or the like is not used and can be interchanged with another term depending on the situation, in some cases. For example, the term "conductive layer" or "conductive film" can be changed into the term "conductor" in some cases. Furthermore, the term "conductor" can be changed into the term "conductive layer" or "conductive film" in some cases. For example, the term "insulating layer" or "insulating film" can be changed into the term "insulator" in some cases. Furthermore, the term "insulator" can be changed into the term "insulating layer" or "insulating film" in some cases.

In addition, in this specification and the like, for example, the term such as "electrode", "wiring", or "terminal" does not limit the function of a component. For example, an "electrode" is used as part of a wiring in some cases, and vice versa. Furthermore, the term "electrode" or "wiring" also includes, for example, the case where a plurality of "electrodes" or "wirings" are formed in an integrated manner. For example, a "terminal" is used as part of a "wiring", an "electrode", or the like in some cases, and vice versa. Furthermore, the term "terminal" also includes the case where a plurality of "electrodes", "wirings", "terminals", or the like are formed in an integrated manner, for example. Thus, for example, an "electrode" can be part of a "wiring" or a "terminal". Furthermore, a "terminal" can be part of a "wiring" or an "electrode". Moreover, the term "electrode", "wiring", "terminal", or the like is sometimes replaced with the term "region", for example.

In addition, in this specification and the like, for example, the terms such as "wiring", "signal line", and "power supply line" can be interchanged with each other depending on the situation, in some cases. For example, the term "wiring" can be changed into the term "signal line" in some cases. For another example, the term "wiring" can be changed into the term "power supply line" or the like in some cases. Conversely, for example, the term "signal line", "power supply line", or the like can be changed into the term "wiring" in some cases. Furthermore, for example, the term "power supply line" or the like can be changed into the term "signal line" or the like in some cases. Conversely, for example, the term "signal line" or the like can be changed into the term "power supply line" or the like in some cases. Moreover, the term "potential" that is applied to a wiring can be changed into the term "signal" or the like depending on the situation, for example. Conversely, for example, the term "signal" or the like can be changed into the term "potential" in some cases.

In this specification and the like, a "switch" includes a plurality of terminals and has a function of switching (selecting) electrical continuity and discontinuity between the terminals. For example, in the case where a switch includes two terminals and electrical continuity is established between the two terminals, the switch is in a "conduction state" or an "on state". In the case where electrical continuity is not established between the two terminals, the switch is in a "non-conduction state" or an "off state". Note that switching to one of a conduction state and a non-conduction state or maintaining one of a conduction state and a non-conduction state is sometimes referred to as "controlling a conduction state".

That is, a switch has a function of controlling whether current flows therethrough or not. Alternatively, a switch has a function of selecting and changing a current path. For example, an electrical switch or a mechanical switch can be used as the switch. That is, a switch can be any element capable of controlling current, and is not limited to a particular element.

Note that as a kind of a switch, there is a switch which is normally in a non-conduction state and brought into a conduction state by controlling a conduction state; such a switch is referred to as an "A contact" in some cases. Furthermore, as another kind of a switch, there is a switch which is normally in a conduction state and brought into a non-conduction state by controlling a conduction state; such a switch is referred to as a "B contact" in some cases.

Examples of a switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case where a transistor is used as a switch, a "conduction state" or "on state" of the transistor refers to a state where a source electrode and a drain electrode of the transistor can be regarded as being electrically short-circuited. Furthermore, a "non-conduction state" or "off state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch using a MEMS (micro electro mechanical systems) technology. Such a switch includes an electrode that can be moved mechanically, and selects a conduction or non-conduction state with the movement of the electrode.

In this specification and the like, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Note that in this specification and the like, for example, the terms "identical", "the same", "equal", "uniform", and the like (including synonyms of these words) used in describing calculation values and measurement values or in describing objects, methods, events, and the like that can be converted into calculation values or measurement values, allow for a margin of error of ±20% unless otherwise specified.

In this specification and the like, an impurity in a semiconductor refers to, for example, an element other than a main component of a semiconductor layer. For example, an element with a concentration of lower than 0.1 atomic % is an impurity. When an impurity is contained in a semiconductor, for example, the density of defect states in a semiconductor is increased, carrier mobility is decreased, or crystallinity is decreased in some cases. In the case where the semiconductor is an oxide semiconductor, examples of an impurity that changes the characteristics of the semiconductor include Group 1 elements, Group 2 elements, Group 13 elements, Group 14 elements, Group 15 elements, or transition metals other than the main components of the oxide semiconductor. Specific examples include hydrogen (included also in water), lithium, sodium, silicon, boron, phosphorus, carbon, and nitrogen. Moreover, in the case where the semiconductor is a silicon layer, examples of an impurity which changes characteristics of the semiconductor include oxygen, Group 1 elements except hydrogen, Group 2 elements, Group 13 elements, and Group 15 elements.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like, for example. For example, in the case where a metal oxide is used in a semiconductor layer of a transistor, the metal oxide is referred to as an oxide semiconductor in some cases. That is, when a metal oxide is used as a material that can be used for a channel formation region of a transistor that has at least one of an amplifying function, a rectifying function, and a switching function, the metal oxide can be referred to as a metal oxide semiconductor. In addition, the term "OS transistor" can also be referred to as a transistor containing a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined with each other as appropriate.

Embodiments described in this specification are described with reference to the drawings. Note that the embodiments can be implemented in many different modes. Thus, it will be readily understood by those skilled in the art that the modes and details can be changed in various ways without departing from the spirit and scope thereof. Thus, the present invention should not be interpreted as being limited to the description in the embodiments. As for the drawings illustrating the embodiments, in the structures of the invention, the same reference numerals are used in common for the same portions or portions having similar functions in different drawings, and repeated description thereof is omitted in some cases. Furthermore, the same hatch pattern is used for the portions having similar functions throughout the drawings, and the portions are not especially denoted by reference numerals in some cases. Moreover, some components are omitted in a perspective view, a top view, and the like for easy understanding of the drawings in some cases. In the drawings, for example, a hatching pattern or the like is omitted in some cases.

In addition, in the drawings and the like in this specification, the size, the layer thickness, or the region is exaggerated for clarity in some cases. Thus, the drawings are not necessarily limited to the drawings with the illustrated size, aspect ratio, and the like, for example. Note that the drawings schematically illustrate ideal examples, and embodiments of the present invention are not limited to shapes, values, and the like illustrated in the drawings, for example. For example, variation in signal, voltage, or current due to noise or variation in signal, voltage, or current due to difference in timing can be included.

In the drawings and the like in this specification, arrows indicating the X direction, the Y direction, and the Z direction are illustrated in some cases. In this specification and the like, the "X direction" is a direction along the X-axis, and the forward direction and the reverse direction are not distinguished in some cases, unless otherwise specified. The same applies to the "Y direction" and the "Z direction". The X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases.

In this specification and the like, when a plurality of components are denoted by the same reference numerals, and in particular need to be distinguished from each other, an identification sign such as "A", "b", "_1", "[n]", or "[m, n]" is sometimes added to the reference numerals, for example.

Embodiment 1

A semiconductor device of one embodiment of the present invention is described. The semiconductor device of one embodiment of the present invention can be used for part of a CPU, an MPU, or an MCU, for example. For another example, the semiconductor device can be used for part of a display apparatus, an electronic device, or the like.

Structure Example

FIG. 1 is a diagram describing a structure example of a semiconductor device of one embodiment of the present invention. A semiconductor device 100 includes a component 101-1 to a component 101-L (L is an integer greater than or equal to 2) and an instruction portion 102 having a function of individually controlling whether power is supplied to each of the component 101-1 to the component 101-L.

Each of the component 101-1 to the component 101-L includes a power supply line 103 and a switch 105 having a function of switching electrical connection (conduction or non-conduction) with a functional circuit 104.

Note that each of the component 101-1 to the component 101-L may share the power supply line 103. Alternatively, at least one of the component 101-1 to the component 101-L may include the power supply line 103 in a system different from the power supply line 103 included in the other components.

The functional circuit 104 has a function of performing data transmission with the functional circuit 104 included in another component and performing predetermined processing on the basis of the data. Examples of the predetermined processing include an arithmetic operation (e.g., an arithmetical operation or a logic operation), writing to a memory circuit, and reading from a memory circuit.

The functional circuit 104 may have a function of performing data transmission with a functional device (not illustrated) provided outside the semiconductor device 100. In this case, the functional circuit 104 can function as an interface between the semiconductor device 100 and the functional device. Examples of the functional device include an input device, an output device, and a memory device.

When the switch 105 is in an on state (conduction state), the functional circuit 104 has a function of being brought into an active state (operation state) when power is supplied from the power supply line 103 to the functional circuit 104 through the switch 105. When the switch 105 is in an off state (non-conduction state), the functional circuit 104 has a function of being brought into a power gated state (non-operation state) when power is not supplied from the power supply line 103 to the functional circuit 104.

The switch 105 can be formed using an OS transistor (a transistor including a metal oxide in a semiconductor layer where a channel is formed), for example. Such an OS transistor has a feature of an extremely low leakage current in an off state. Thus, power can be prevented from being supplied from the power supply line 103 to the functional circuit 104 due to leakage current flowing through the switch 105 in a power gated state. Thus, low power consumption can be achieved.

The functional circuit 104 includes a memory portion 106 storing setting information of the functional circuit 104. The setting information is, for example, an instruction that directs the execution of predetermined processing or an instruction that directs the execution of data transmission with the functional circuit 104 included in another component, for example. Alternatively, examples of the setting information include the presence or absence of the functional device, the type of the functional device, the specifications of the functional device, and the driving method of the functional device when data transmission with the functional device provided outside the semiconductor device 100 is performed.

The memory portion 106 includes a memory circuit 107 having a function of storing setting information in an active state and a memory circuit 108 having a function of storing setting information in a power gated state. In an active state, the functional circuit 104 has a function of performing the predetermined processing on the basis of the setting information stored in the memory circuit 107.

The circuit 108 is preferably formed using an OS transistor, for example. As a memory circuit using an OS transistor, for example, a structure in which one of a source and a drain of an OS transistor is connected to a gate of a Si transistor (a transistor including silicon in a semiconductor layer where a channel is formed) is given. The OS transistor has a feature of an extremely low leakage current in an off state. Thus, when the OS transistor in the memory circuit is brought into an off state when power gating is performed, charge of the gate of the Si transistor can be retained. Thus, charge in accordance with the setting information can be retained continuously in a power gated state.

Note that for circuits other than the memory circuit 108 in the functional circuit 104, a Si transistor may be used, for example. The Si transistor has higher operation speed than the OS transistor. For example, by electrically connecting a gate of an n-channel Si transistor and a gate of a p-channel Si transistor, a CMOS circuit (e.g., a circuit that operates complementarily, a CMOS logic gate, a CMOS logic circuit, or the like) can be formed. Thus, the operation speed of the functional circuit 104 can be increased, and power consumption in a steady state can be reduced.

The semiconductor layer of the OS transistor preferably contains at least one of indium and zinc. The semiconductor layer of the OS transistor preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, the element M is preferably one or more kinds selected from gallium, aluminum, yttrium, and tin.

It is particularly preferable to use an oxide containing indium (In), gallium (Ga), and zinc (Zn) (also referred to as "IGZO") for the semiconductor layer. Alternatively, an oxide containing indium (In), aluminum (Al), and zinc (Zn) (also referred to as "IAZO") may be used for the semiconductor layer. Further alternatively, an oxide containing indium (In), aluminum (Al), gallium (Ga), and zinc (Zn) (also referred to as "IAGZO") may be used for the semiconductor layer.

In the case where the semiconductor layer is an In-M-Zn oxide, the atomic proportion of In is preferably greater than or equal to the atomic proportion of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. The atomic ratio of In may be smaller than the atomic ratio of M in the In-M-Zn oxide. Examples of the atomic ratio of the metal elements in such an In-M-Zn oxide include In:M:Zn=1:3:2 or a composition in the neighborhood thereof or In:M:Zn=1:3:4 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the content ratio of each element is as follows; Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where the content ratio of each element is as follows; Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where the content ratio of each element is as follows; Ga is greater than 0.1 and less than or equal to 2 and Zn is greater than 0.1 and less than or equal to 2 with In being 1.

In the semiconductor device 100, for example, a layer including an OS transistor may be provided to overlap with a layer including a Si transistor. With such a structure, the area overhead caused by providing the switch 105 and the memory circuit 108 can be reduced.

The functional circuit 104 can perform first to third operations. In the first operation, initialization processing for storing the setting information on the memory circuit 107 is performed, so that the functional circuit 104 is brought into an active state. In the second operation, the setting information stored in the memory circuit 107 is written to the memory circuit 108, and the functional circuit 104 is brought into a power gated state. In the third operation, the setting information read from the memory circuit 108 is stored in the memory circuit 107, whereby the functional circuit 104 is brought into an active state.

Thus, when the second operation is performed by the functional circuit 104, the setting information is prevented from disappearing from the memory portion 106 when the functional circuit 104 is shifted to the power gated state. In addition, when the third operation is performed, the initialization processing can be omitted when returning to the active state. That is, since the first operation is not required to be performed again, time taken for the first operation is eliminated and the operation speed can be increased. Moreover, power consumption due to the first operation is eliminated and low power consumption can be achieved.

Note that the memory portion 106 included in the functional circuit 104 may only include the memory circuit 108. In this case, the functional circuit 104 may have a function of performing predetermined processing on the basis of setting information stored in the memory circuit 108 in an active state. With such a structure, time for transmitting and receiving the setting information between the memory circuit 108 and the memory circuit 107 is eliminated in the second operation and the third operation, so that the operation speed can be increased. Moreover, power consumption for transmitting and receiving the setting information between the memory circuit 108 and the memory circuit 107 is eliminated and low power consumption can be achieved.

The instruction portion 102 has a function of individually controlling the active state or the power gated state of each of the component 101-1 to the component 101-L. In accordance with processing performed by the semiconductor device 100, the instruction portion 102 has a function of bringing components of the component 101-1 to the component 101-L that contribute to the processing into an active state and bringing components of the component 101-1 to the component 101-L that do not contribute to the processing into a power gated state.

Among the component 101-1 to the component 101-L, the instruction portion 102 can control a component to be shifted to the power gated state so that the switch 105 is brought into an off state after the functional circuit 104 performs the second operation. Furthermore, a component to be returned to the active state can be controlled so that the switch 105 is brought into an on state after the functional circuit 104 performs the third operation.

Although not illustrated, a structure may be employed in which, for example, the instruction portion 102 includes a memory circuit so that control data selecting an active state or a power gated state of each of the component 101-1 to the component 101-L is stored in the memory circuit. A structure may be employed in which control data to be stored in the memory circuit is rewritten in accordance with the processing performed by the semiconductor device 100, thereby switching the active state or the power gated state of each of the component 101-1 to the component 101-L.

The semiconductor device 100 of one embodiment of the present invention can perform power gating at fine granularity in accordance with the processing performed by the semiconductor device 100. That is, among the component 101-1 to the component 101-L, components that do not contribute to the processing are brought into a power gated state by the instruction portion 102, whereby power consumption of the component is eliminated and low power consumption can be achieved.

For example, in the MCU including the semiconductor device of one embodiment of the present invention, power gating at fine granularity can be performed for each component such as a processor core, a memory, and an interface included in the MCU, whereby lower power consumption can be achieved.

Structure Example 1 of Memory Circuit

FIG. 2A to FIG. 2F are block diagrams each illustrating a structure example of a circuit that can be used as the memory circuit 108. In the block diagram in FIG. 2A, a memory cell array 90, a word line driver circuit 91, and a bit line driver circuit 92 are illustrated.

The memory cell array 90 includes memory cells MC provided in a matrix of m rows and n columns (m and n are each a positive integer). The memory cells MC are connected to a word line WL_1 to a word line WL_m and a bit line BL_1 to a bit line BL_n. The memory cells MC may be connected to a source line for supplying current, a wiring for applying a potential to a back gate of a transistor, a capacitor line for fixing a potential of one electrode of a capacitor, or the like, in addition to the bit lines and the word lines.

The word line driver circuit 91 is a circuit that outputs a signal for selecting the memory cells MC in each row. Word lines for data writing and word lines for data reading may be provided separately for the word line WL_1 to the word line WL_m.

The bit line driver circuit 92 is a circuit for writing data into the memory cell MC in each column or for reading out data from the memory cells MC. Bit lines for data writing and bit lines for data reading may be provided separately for the bit line BL_1 to the bit line BL_n.

Figure 2A:
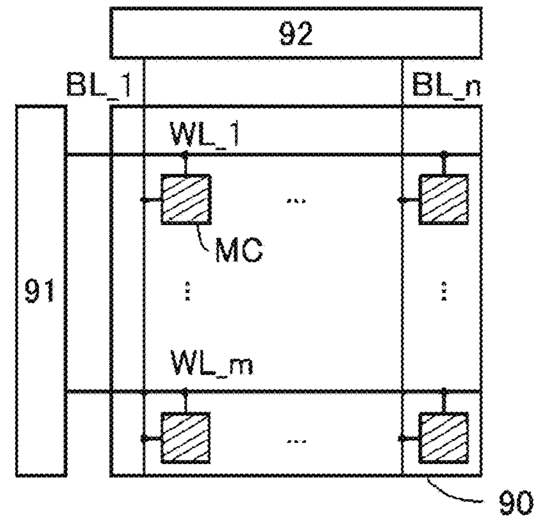
FIG. 2A to FIG. 2F are diagrams each illustrating a structure example of a semiconductor device.

FIG. 2B to FIG. 2F each illustrate an example of a circuit structure that can be employed for the memory cell MC illustrated in FIG. 2A.

Figures 2B, 2C, 2D:
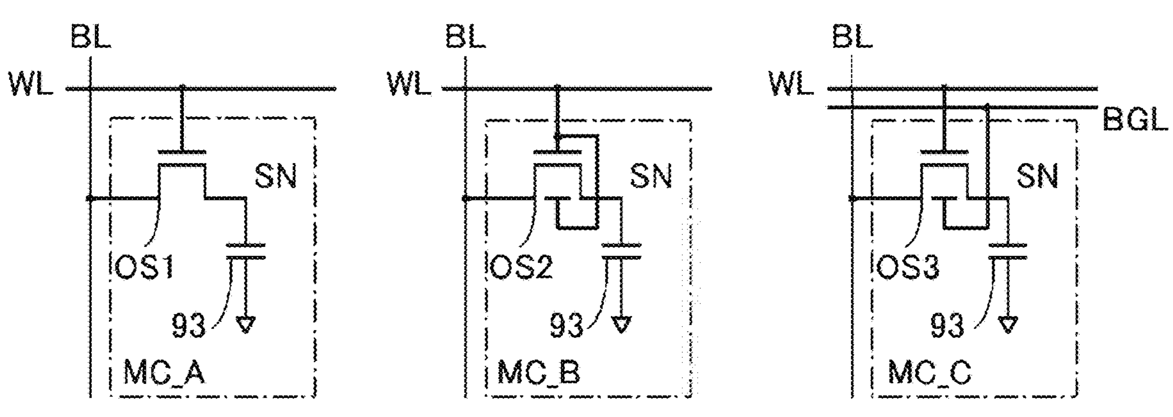

A memory cell MC_A illustrated in FIG. 2B includes a transistor OS1 and a capacitor 93. The transistor OS1 is an OS transistor. An OS transistor has a feature of an extremely low off-state current. Thus, bringing the transistor OS1 into a non-conduction state allows a charge retention node SN to retain charge in accordance with data. Thus, the refresh rate of the data in accordance with charge retained in the charge retention node SN can be reduced.

A memory cell MC_B illustrated in FIG. 2C includes a transistor OS2 and the capacitor 93. The transistor OS2 is an OS transistor. The transistor OS2 is different from the transistor OS1 in FIG. 2B in that the transistor OS2 includes a back gate, and the back gate and the gate are electrically connected to each other so that a potential of a word line WL is applied from both the back gate and the gate. Adopting such a structure can increase the amount of current flowing between a source and a drain when the transistor OS2 is brought into a conduction state.

A memory cell MC_C illustrated in FIG. 2D includes a transistor OS3 and the capacitor 93. The transistor OS3 is an OS transistor. The transistor OS3 is different from the transistor OS1 in FIG. 2B in that the transistor OS3 includes a back gate, and the back gate and a back gate line BGL are electrically connected to each other so that a potential different from that of the gate is applied to the back gate. Adopting such a structure enables control of the amount of current flowing between a source and a drain by control of the threshold voltage of the transistor OS3.

Figures 2E, 2F:
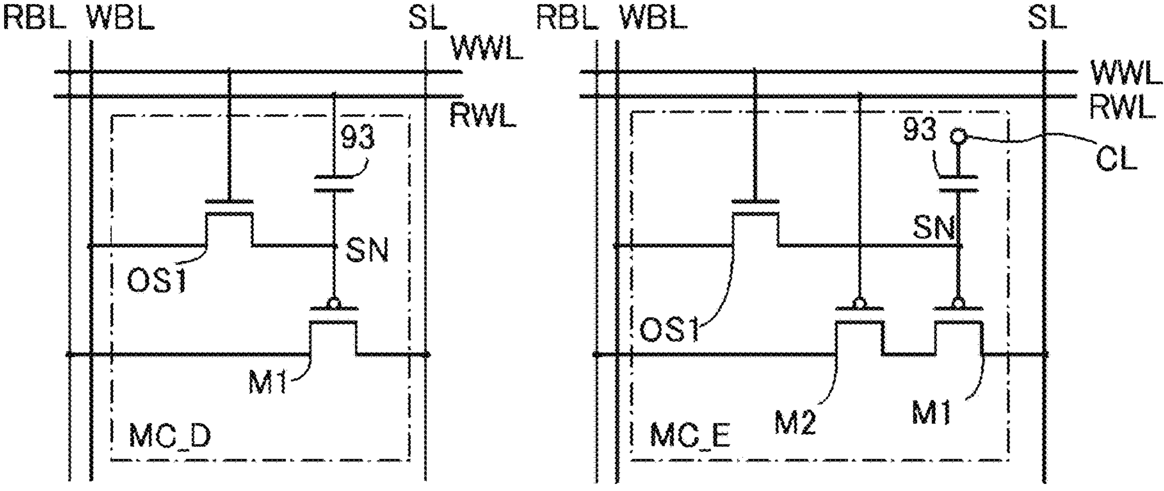

A memory cell MC_D illustrated in FIG. 2E includes the transistor OS1, a transistor M1, and the capacitor 93. One of a source and a drain of the transistor OS1 is connected to a write bit line WBL. The other of the source and the drain of the transistor OS1 is connected to a gate of the transistor M1 and one electrode of the capacitor 93. A gate of the transistor OS1 is connected to a write word line WWL. The other electrode of the capacitor 93 is connected to a read word line RWL. One of a source and a drain of the transistor M1 is connected to a read bit line RBL. The other of the source and the drain of the transistor M1 is connected to a source line SL. Although a p-channel transistor is illustrated as the transistor M1, an n-channel transistor may also be employed. Bringing the transistor OS1 into a non-conduction state allows the charge retention node SN to retain charge in accordance with data. The transistor M1 is a Si transistor. Note that the transistor OS1 may also have a structure similar to that of the above transistor OS2 or the above transistor OS3.

A memory cell MC_E illustrated in FIG. 2F includes the transistor OS1, the transistor M1, a transistor M2, and the capacitor 93. One of the source and the drain of the transistor OS1 is connected to the write bit line WBL. The other of the source and the drain of the transistor OS1 is connected to the gate of the transistor M1 and the one electrode of the capacitor 93. The gate of the transistor OS1 is connected to the write word line WWL. The other electrode of the capacitor 93 is connected to a capacitor line CL. One of the source and the drain of the transistor M1 is connected to one of a source and a drain of the transistor M2. The other of the source and the drain of the transistor M1 is connected to the source line SL. A gate of the transistor M2 is connected to the read word line RWL. The other of the source and the drain of the transistor M2 is connected to the read bit line RBL. Although a p-channel transistor is illustrated as the transistor M2, an n-channel transistor may also be employed. Bringing the transistor OS1 into a non-conduction state allows the charge retention node SN to retain charge in accordance with data. The transistor M2 is a Si transistor. Note that the transistor OS1 may also have a structure similar to that of the above transistor OS2 or the above transistor OS3.

Note that the structures of the memory cells illustrated in FIG. 2B to FIG. 2D are each referred to as a DOSRAM (registered trademark). The DOSRAM is an abbreviation for a Dynamic Oxide Semiconductor RAM (Random Access Memory). In the structure using the DOSRAM, when one of a source and a drain of an OS transistor and one electrode of the capacitor are electrically connected to each other, charge of the one electrode of the capacitor can be retained when the OS transistor is brought into a non-conduction state. In particular, a structure using the DOSRAM is effective in the case where the stored data is increased. For example, as compared to a structure where memory cells in the memory circuit are formed with an SRAM (Static RAM), the structure using the DOSRAM can inhibit an increase in a circuit area. In particular, the structures of the memory cells illustrated in FIG. 2B to 2D are effective in inhibiting an increase in the circuit area.

The structures of the memory cells illustrated in FIG. 2E and FIG. 2F are each referred to as a NOSRAM (registered trademark). The NOSRAM is an abbreviation for a Nonvolatile Oxide Semiconductor RAM. In the structure using the NOSRAM, when one of a source and a drain of an OS transistor and a gate of the Si transistor are electrically connected to each other, charge of the gate of the Si transistor can be retained when the OS transistor is brought into a non-conduction state. Thus, the NOSRAM can be used as a nonvolatile memory. That is, bringing the OS transistor into a non-conduction state allows data to be retained even in a power gated state, so that the OS transistor is suitably used for the memory circuit 108.

Note that the circuit structures illustrated in FIG. 2B to FIG. 2F are merely examples, and any other structures can be employed as long as one embodiment of the present invention can be achieved.

Structure Example 2 of Memory Circuit

Figure 3:
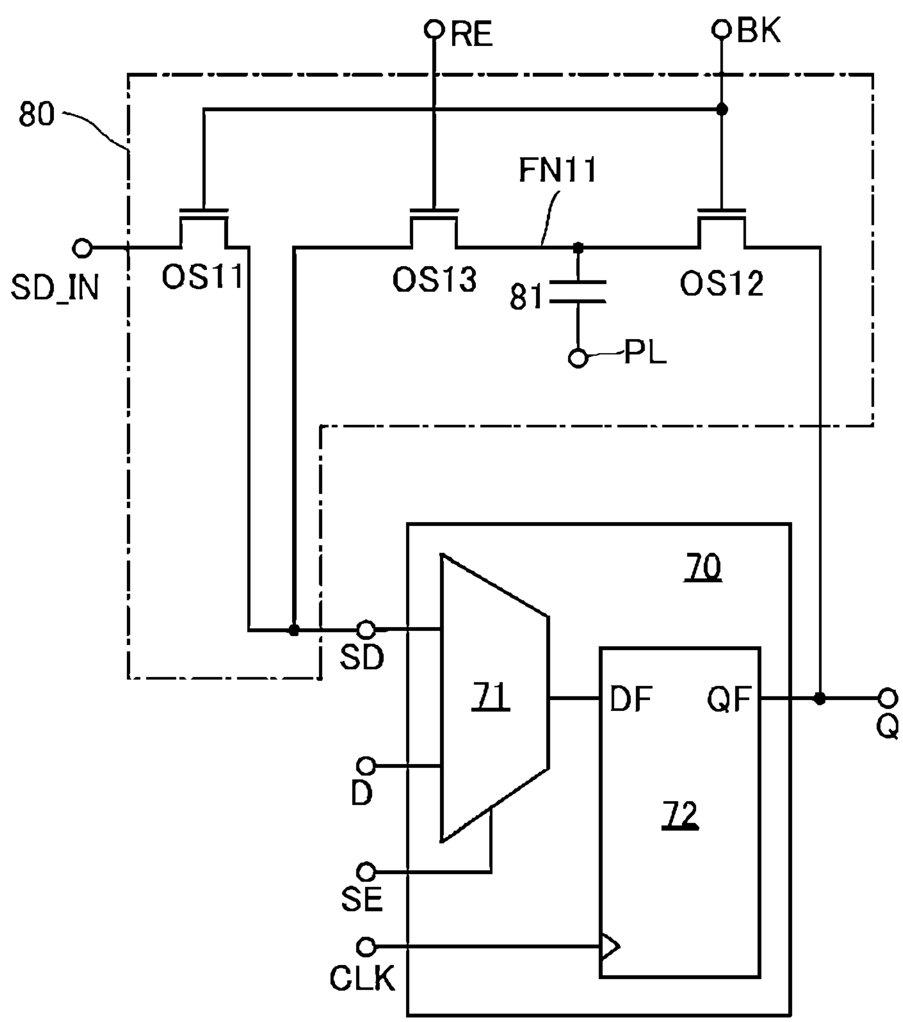
FIG. 3 is a diagram illustrating a structure example of a semiconductor device.

FIG. 3 is a block diagram illustrating a structure example of a circuit that can be used in the memory portion 106 including the memory circuit 107 and the memory circuit 108. The circuit illustrated in FIG. 3 includes a scan flip-flop 70 and a data memory circuit 80.

The scan flip-flop 70 includes a selector 71 and a flip-flop 72. The selector 71 has a function of transmitting data input to a terminal D or a terminal SD to a terminal DF of the scan flip-flop 70 in accordance with a selection signal input from a terminal SE. The terminal D is a terminal for supplying data input from the outside. The terminal SD is a terminal for supplying data input from the data memory circuit 80. The flip-flop 72 has a function of storing data of the terminal DF in accordance with a clock signal input from a terminal CLK and outputting stored data from a terminal QF to a terminal Q. Examples of the flip-flop 72 include a D flip-flop. Note that the selector 71 and the flip-flop 72 can be formed using Si transistors, for example.

The data memory circuit 80 includes a transistor OS11, a transistor OS12, a transistor OS13, and a capacitor 81. One of a source and a drain of the transistor OS12 and one of a source and a drain of the transistor OS13 are electrically connected to one electrode of the capacitor 81. The other of the source and the drain of the transistor OS12 is electrically connected to the terminal Q. One of a source and a drain of the transistor OS11 and the other of the source and the drain of the transistor OS13 are connected to the terminal SD. The other of the source and the drain of the transistor OS11 is electrically connected to a terminal SD_IN. The other electrode of the capacitor 81 is electrically connected to a terminal PL.

The transistor OS11 has a function of selecting whether data input from the terminal SD_IN is transmitted to the terminal SD in accordance with a signal input from a terminal BK. The terminal SD_IN is a terminal for supplying data for a scan test. The transistor OS12 has a function of selecting whether data in the terminal Q is transmitted to a node FN11 in accordance with a signal input from the terminal BK. The transistor OS13 has a function of selecting whether data in the node FN11 is transmitted to the terminal SD in accordance with a signal input from a terminal RE. The capacitor 81 has a function of storing data by retaining charge of the node FN11 when the transistor OS12 and the transistor OS13 are in non-conduction states.

The transistor OS11 to the transistor OS13 are OS transistors. The OS transistor has a feature of an extremely low off-state current. Thus, when the transistor OS12 and the transistor OS13 are brought into a non-conduction states, charge of the node FN11 can be retained continuously in the capacitor 81. Thus, the data memory circuit 80 can be used as a nonvolatile memory.

When the transistor OS12 is brought into a conduction state, the data memory circuit 80 can write data in the terminal Q to the node FN11. When the transistor OS12 and the transistor OS13 are brought into non-conduction states, data in the node FN11 can be retained continuously. When the transistor OS13 is brought into a conduction state, data in the node FN11 can be read to the terminal SD.

The circuit illustrated in FIG. 3 can be suitably used as the memory portion 106 by making the scan flip-flop 70 correspond to the memory circuit 107 and making the data memory circuit 80 correspond to the memory circuit 108. That is, supply of a predetermined signal to the terminal BK and the terminal RE allows data to be written from the scan flip-flop 70 to the data memory circuit 80 (corresponding to the second operation), the data in the memory circuit 80 to be stored (corresponding to the power gated state), and the data to be read from the data memory circuit 80 to the scan flip-flop 70 (corresponding to the third operation).

Note that the circuit structure illustrated in FIG. 3 is merely an example, and any other structures can be employed as long as one embodiment of the present invention can be achieved.

Operation Example

FIG. 4A to FIG. 4F are diagrams each illustrating an operation example of the semiconductor device of one embodiment of the present invention. A semiconductor device 110 includes a processor core CORE, a memory MEM, an interface IF1, and an interface IF2. The processor core CORE includes a register CORE_REG and a memory CORE_MEM. The interface IF1 includes a register IF1_REG and a memory IF1_MEM. The interface IF2 includes a register IF2_REG and a memory IF2_MEM.

Note that although not illustrated for simplicity of description, the processor core CORE includes a general-purpose register composed of a plurality of nonvolatile registers, and the nonvolatile registers each include the register CORE_REG and the memory CORE_MEM. The register CORE_REG corresponds to the above memory circuit 107 (see FIG. 1), and the memory CORE_MEM corresponds to the above memory circuit 108 (see FIG. 1). The interface IF1 includes a setting register composed of a plurality of nonvolatile registers, and the nonvolatile registers each include the register IF1_REG and the memory IF1_MEM. The register IF1_REG corresponds to the memory circuit 107, and the memory IF1_MEM corresponds to the memory circuit 108. The interface IF2 includes a setting register composed of a plurality of nonvolatile registers, and the nonvolatile registers each include the register IF2_REG and the memory IF2_MEM. The register IF2_REG corresponds to the memory circuit 107, and the memory IF2_MEM corresponds to the memory circuit 108.

In an active state, the processor core CORE has a function of performing an arithmetic operation on the basis of setting information and data stored in the register CORE_REG. In a power gated state, the processor core CORE has a function of storing the setting information in the memory CORE_MEM. The memory MEM has a function of storing data. In an active state, the interface IF1 has a function of performing data transmission with a functional device (not illustrated) provided outside the semiconductor device 110 on the basis of the setting information stored in the register IF1_REG. In a power gated state, the interface IF1 has a function of storing setting information in the memory IF1_MEM. In an active state, the interface IF2 has a function of performing data transmission with the functional device provided outside the semiconductor device 110 on the basis of the setting information stored in the register IF2_REG.

Note that the functional device provided outside the semiconductor device 110 can perform data transmission with the processor core CORE or the memory MEM through the interface IF1 or the interface IF2. Examples of the functional device include an input device, an output device, and a memory device.

Each of the processor core CORE, the memory MEM, the interface IF1, and the interface IF2 preferably includes a power supply control switch (not illustrated) having a function of selecting power supply thereto. The power supply control switch can be formed using an OS transistor, for example.

In addition, the semiconductor device 110 includes a power management unit (not illustrated) having a function of controlling power supply to each of the processor core CORE, the memory MEM, the interface IF1, and the interface IF2.

The semiconductor device 110 can correspond to the semiconductor device 100 illustrated in FIG. 1 as appropriate. That is, the processor core CORE, the memory MEM, the interface IF1, and the interface IF2 can correspond to the component 101-1 to the component 101-4 included in the semiconductor device 100, respectively. Each of the register CORE_REG and the registers IF1_REG, and IF2_REG can correspond to the memory circuit 107. Each of the memory CORE_MEM, the memories IF1_MEM, and IF2_MEM can correspond to the memory circuit 108. The power supply control switch can correspond to the switch 105. The power management unit can correspond to the instruction portion 102. Therefore, the description of the semiconductor device 100 described above can be referred to as appropriate, and thus the description of the semiconductor device 110 may be omitted as appropriate.

Note that in the semiconductor device 110, the structure illustrated in FIG. 3 can be suitably used as a nonvolatile register included in each of the processor core CORE, the interface IF1, and the interface IF2. That is, each of the register CORE_REG, the register IF1_REG, and the register IF2_REG can correspond to the scan flip-flop 70, and each of the memory CORE_MEM, the memory IF1_MEM, and the memory IF2_MEM can correspond to the data memory circuit 80. Predetermined signals supplied to the terminal BK and the terminal RE included in the data memory circuit 80 are individually controlled, so that writing of setting information, storing of setting information, and reading of setting information can be performed for every data memory circuit 80.

The semiconductor device 110 can perform power gating at fine granularity. That is, in accordance with processing performed by the semiconductor device 110, the components (the processor core CORE, the memory MEM, the interface IF1, and the interface IF2) included in the semiconductor device 110 can be individually controlled to be in an active state or a power gated state.

Figure 4A:
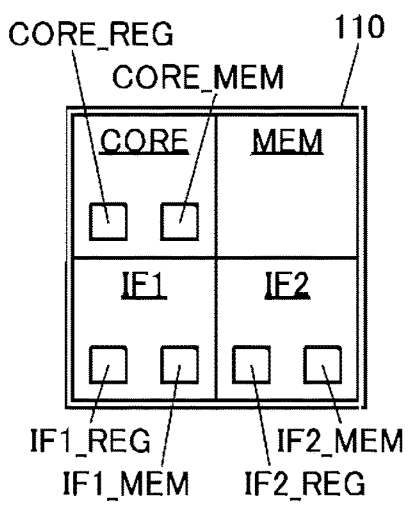
FIG. 4A to FIG. 4F are diagrams each illustrating an example of an operation method of a semiconductor device.
Figure 4B:
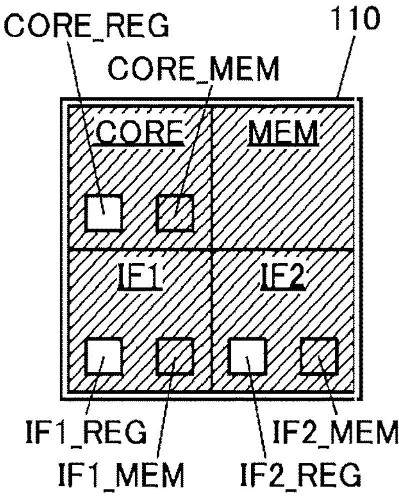

In FIG. 4A to FIG. 4F, components without hatching are in an active state, and components with hatching are in a power gated state. That is, FIG. 4A illustrates that all of the processor core CORE, the memory MEM, the interface IF1, and the interface IF2 are in an active state. FIG. 4B illustrates that all of the processor core CORE, the memory MEM, the interface IF1, and the interface IF2 are in a power gated state.

Figure 4C:
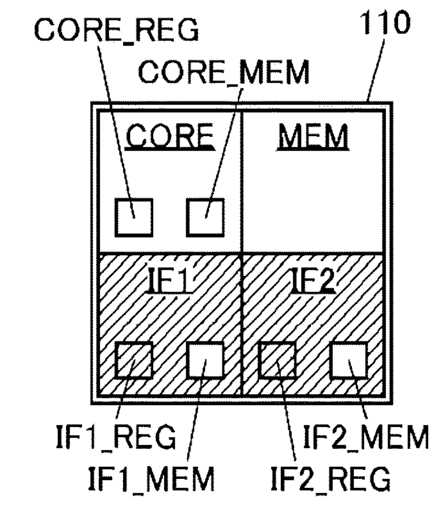

FIG. 4C illustrates, for example, an active state or a power gated state of each component included in the semiconductor device 110 in the case where the load instruction or the store instruction of data for a general-purpose register included in the processor core CORE is executed. In processing of the load instruction of data, data read from the memory MEM is stored in the register CORE_REG. In processing of the store instruction of data, data stored in the register CORE_REG is written to the memory MEM. That is, the components that contribute to the processing of the load instruction or the store instruction of data are only the processor core CORE and the memory MEM. That is, the interface IF1 and the interface IF2 do not directly contribute to the processing of the load instruction or the store instruction of data. Thus, in the semiconductor device 110, only the processor core CORE and the memory MEM can be brought into an active state and the interface IF1 and the interface IF2 can be brought into a power gated state. With such a structure, power consumption of the interface IF1 and the interface IF2 is reduced and low power consumption can be achieved.

Figure 4D:
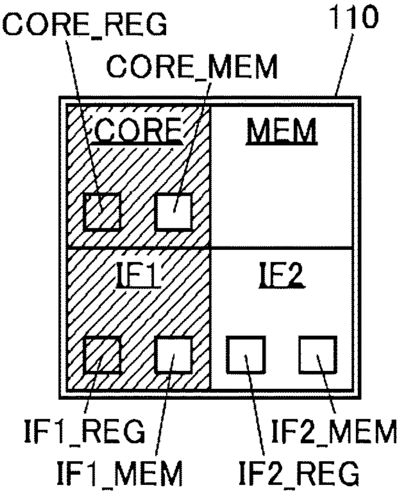

FIG. 4D illustrates, for example, an active state or a power gated state of each component included in the semiconductor device 110 in the case where data transfer is executed by a DMA (Dynamic Memory Access). In processing of data transfer by the DMA, for example, data transfer between the memory MEM and the functional device through the interface IF2 is performed without the processor core CORE. That is, the components that contribute to the processing of data transfer by the DMA are only the memory MEM and the interface IF2. That is, the processor core CORE and the interface IF1 do not directly contribute to the processing of data transfer by the DMA. Thus, in the semiconductor device 110, only the memory MEM and the interface IF2 can be brought into an active state, and the processor core CORE and the interface IF1 can be brought into a power gated state. With such a structure, power consumption of the processor core CORE and the interface IF1 is reduced and low power consumption can be achieved.

Figure 4E:
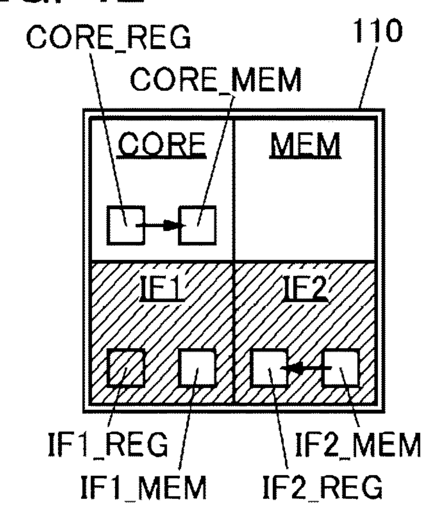

FIG. 4E and FIG. 5A are, respectively, a diagram and a flowchart illustrating the operation of the semiconductor device 110 in the case where a state in which the load instruction or the store instruction of data for the general-purpose register included in the processor core CORE is executed (the state in FIG. 4C) is shifted to a state in which data transfer by the DMA is executed (the state in FIG. 4D), for example.

As illustrated in FIG. SA, first, setting information of the processor core CORE stored in the register CORE_REG is written to the memory CORE_MEM (corresponding to the second operation) in Step S11. Next, in Step S12, the processor core CORE is shifted to a power gated state. At this time, the setting information stored in the register CORE_REG is lost, but the setting information written to the memory CORE_MEM is continuously stored. Next, in Step S13, setting information of the interface IF2 read from the memory IF2_MEM is stored in the register IF2_REG (corresponding to the third operation). Next, in Step S14, the interface IF2 is returned to an active state. At this time, the initialization processing (corresponding to the first operation) of the setting information is not performed again and data transfer by the DMA can be performed immediately, so that the operation speed can be increased. Furthermore, power consumption due to the initialization processing is reduced and low power consumption can be achieved.

Figure 4F:
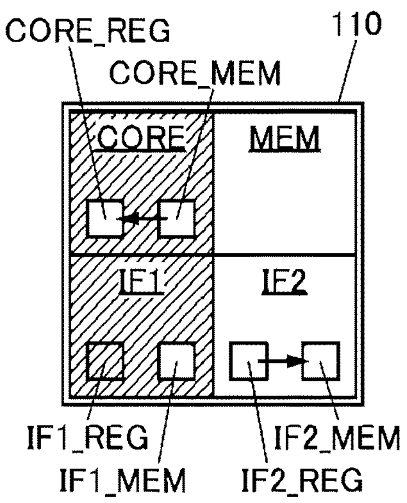

FIG. 4F and FIG. 5B are, respectively, a diagram and a flow chart illustrating the operation of the semiconductor device 110 in the case where a state in which processing of data transfer by the DMA is executed (the state in FIG. 4D) is shifted to a state in which processing of the load instruction or the store instruction of data for the general-purpose register included in the processor core CORE is executed (the state in FIG. 4C), for example.

As illustrated in FIG. 5B, first, the setting information of the interface IF2 stored in the register IF2_REG is written to the memory IF2_MEM in Step S21 (corresponding to the second operation). Next, in Step S22, the interface IF2 is shifted to a power gated state. At this time, the setting information stored in the register IF2_REG is lost, but the setting information written to the memory IF2_MEM is continuously stored. Next, in Step S23, the setting information of the processor core CORE read from the memory CORE_MEM is stored in the register CORE_REG (corresponding to the third operation). Next, in Step S24, the processor core CORE is returned to an active state. At this time, the initialization processing of the setting information (corresponding to the first operation) is not performed again and processing of the load instruction or the store instruction of data for the register CORE_REG can be executed immediately, and thus the operation speed can be increased. Furthermore, power consumption due to the initialization processing is reduced and low power consumption can be achieved.

In the semiconductor device 110 of one embodiment of the present invention, among the components included in the semiconductor device 110, only the components that actually contribute to processing can be brought into an active state, and the components that do not contribute to the processing can be brought into a power gated state. Thus, power consumption of the components that do not contribute to the processing is reduced and low power consumption can be achieved. That is, it is possible to reduce power consumption even during the operation of the semiconductor device.

Although the semiconductor device 110 of one embodiment of the present invention is illustrated as an example including two interfaces (the interface IF1 and the interface IF2), three or more interfaces may be included. Even in a semiconductor device with a wide variety of interfaces and a large circuit scale, power consumption can be reduced with the suitable use of the structure of the present invention.

Note that the semiconductor device of one embodiment of the present invention is not limited to the semiconductor device 100 and the semiconductor device 110 described above. At least part of the structure examples, the operation examples, the drawings corresponding thereto, and the like described in this embodiment as an example can be combined with the other structure examples, the other operation examples, the other drawings, and the other embodiments described in this specification and the like as appropriate.

Embodiment 2

In this embodiment, a structure example of a display apparatus including a semiconductor device of one embodiment of the present invention is described.

Structure Example 1

Figure 6A:
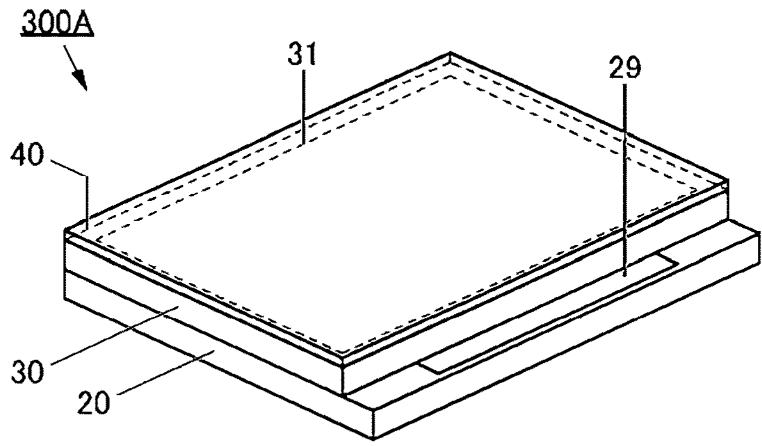
FIG. 6A and FIG. 6B are diagrams each illustrating a structure example of a display apparatus.
Figure 6B:
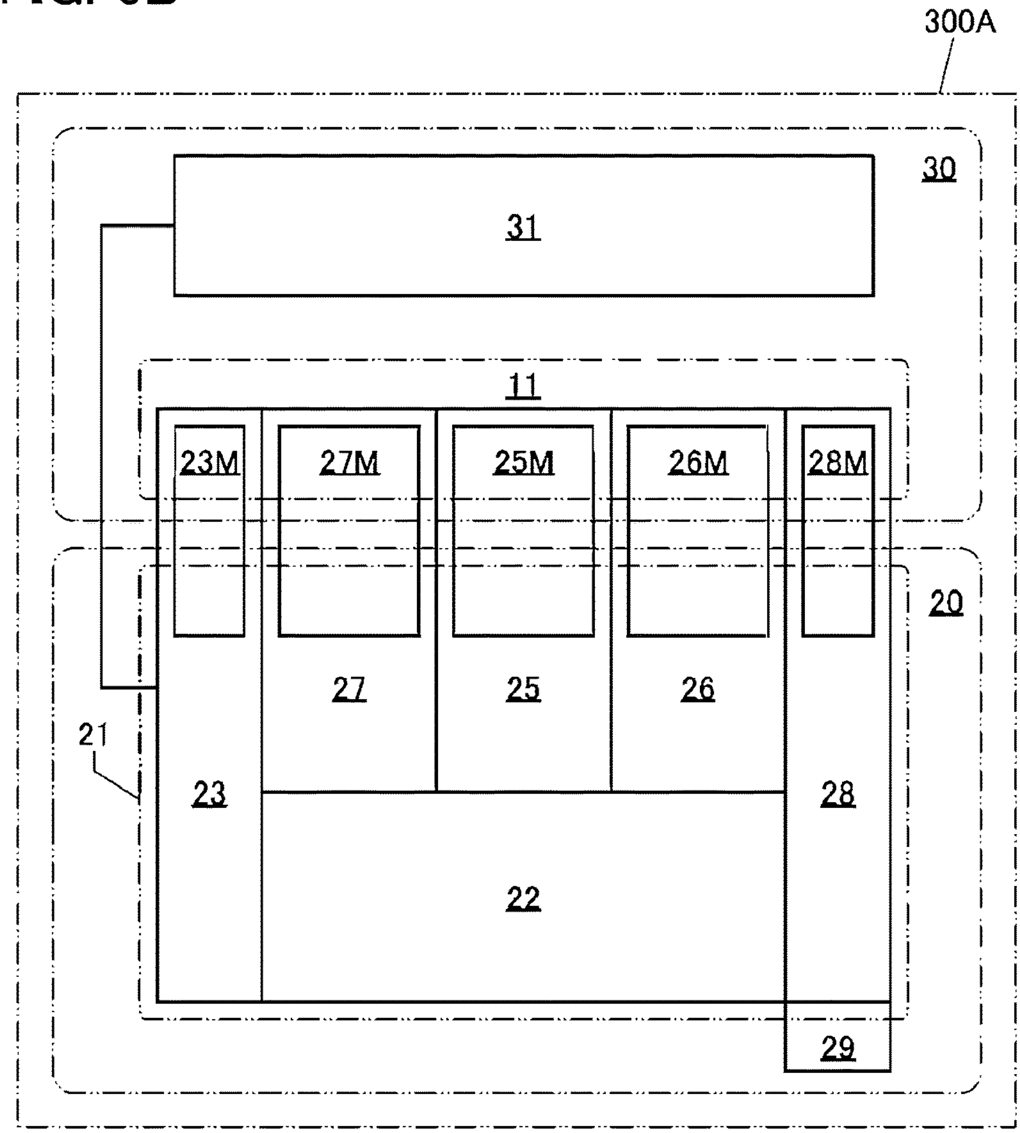
Figure 7:
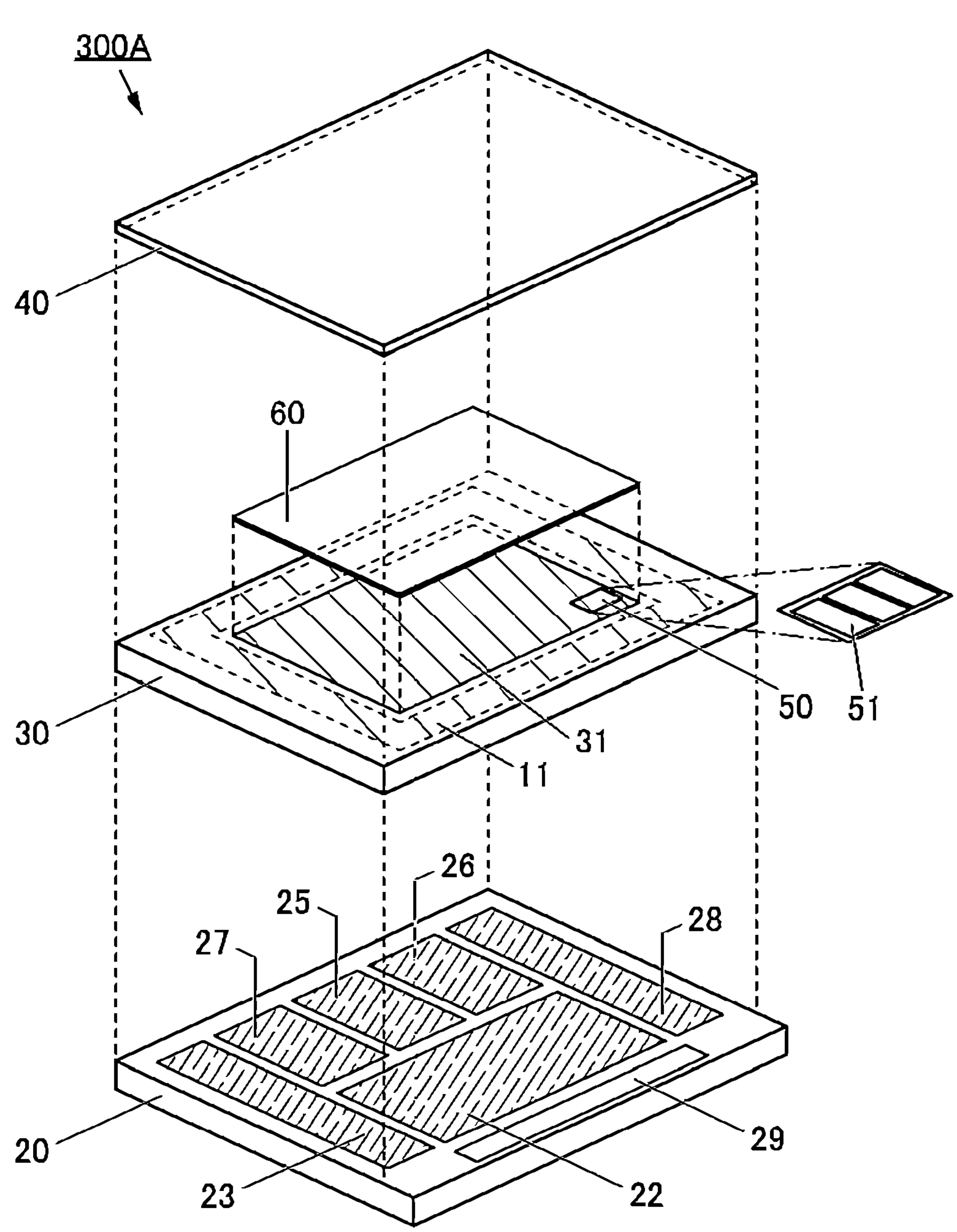
FIG. 7 is a diagram illustrating a structure example of a display apparatus.

FIG. 6A and FIG. 7 are perspective views of a display apparatus 300A of one embodiment of the present invention. FIG. 6B is a block diagram illustrating a structure of the display apparatus 300A. The display apparatus 300A includes a layer 30 over a layer 20 and a sealing substrate 40 over the layer 30. Note that in FIG. 7, in order to elucidate the structure of the display apparatus 300A, for example, the layer 20, the layer 30, the layer 60, the sealing substrate 40, and the like are illustrated separately. As illustrated in FIG. 7, the layer 30 includes a memory portion 11 and a display portion 31. A layer 60 is provided between the sealing substrate 40 and the display portion 31. In FIG. 7, a structure in which the memory portion 11 is provided in a peripheral portion of a region where the display portion 31 is provided in the layer 30 is illustrated as an example.

The layer 20 includes a functional circuit 21 and a terminal portion 29. The functional circuit 21 includes a control circuit 22, a display portion driver circuit 23, an image processing circuit 25, a sensor circuit 26, a communication circuit 27, and an input/output circuit 28.

The display portion driver circuit 23, the image processing circuit 25, the sensor circuit 26, the communication circuit 27, and the input/output circuit 28 include a memory circuit 23M, a memory circuit 25M, a memory circuit 26M, a memory circuit 27M, and a memory circuit 28M each having a function of storing data even in a power gated state, respectively.

Each of the display portion driver circuit 23, the image processing circuit 25, the sensor circuit 26, the communication circuit 27, and the input/output circuit 28 preferably includes a power supply control switch (not illustrated) having a function of selecting power supply thereto.

The display apparatus 300A using the semiconductor device of one embodiment of the present invention can correspond to the semiconductor device 100 illustrated in FIG. 1 as appropriate. That is, the functional circuit 21 can correspond to the semiconductor device 100. Thus, the control circuit 22 can correspond to the instruction portion 102, and the display portion driver circuit 23, the image processing circuit 25, the sensor circuit 26, the communication circuit 27, and the input/output circuit 28 can correspond to the component 101-1 to a component 101-5 included in the semiconductor device 100, respectively. Each of the memory circuit 23M, the memory circuit 25M, the memory circuit 26M, the memory circuit 27M, and the memory circuit 28M can correspond to the memory circuit 108. The power supply control switch can correspond to the switch 105. Therefore, the description of the semiconductor device 100 described in Embodiment 1 can be referred to as appropriate, and thus the description in this embodiment is omitted as appropriate in some cases.

Note that the functional circuit 21 does not necessarily include all of the components, and may include another component. For example, at least one of a power supply circuit and a power management circuit or the like controlling whether power is supplied may be included. For example, at least one of a DSP (Digital Signal Processor), an FPGA (Field Programmable Gate Array), and the like may be included. For another example, at least one of a CPU (Central Processing Unit), a GPU (Graphics Processing Unit), and the like may be included. For example, a super-definition circuit or the like may be included. The super-definition circuit has a function of upconverting image data with a lower definition than that of the display portion. The super-definition circuit has a function of downconverting image data with a higher definition than that of the display portion.

Note that the functional circuit 21 is preferably formed using a Si CMOS, i.e., transistors including silicon in their channel formation regions (Si transistors). That is, the layer 20 including the functional circuit 21 is a layer including the Si transistors. When the functional circuit 21 is formed using Si transistors, circuits having a function of the control circuit 22, the display portion driver circuit 23, the image processing circuit 25, the sensor circuit 26, the communication circuit 27, and the input/output circuit 28 can be provided in the functional circuit 21.

For the Si transistors, for example, it is particularly preferable to use silicon with high crystallinity, such as single crystal silicon or polycrystalline silicon, in order to achieve high field-effect mobility and perform higher-speed operation.

The layer 30 is a layer including the OS transistors, that is, transistors including an oxide semiconductor in their channel formation regions. With this structure, the memory portion 11 and the display portion 31 including OS the transistors can be stacked over the layer 20.

An OS transistor has a characteristic of an extremely low off-state current. Thus, for example, when the OS transistor is used as a transistor provided in a pixel circuit, analog data written to the pixel circuit can be continuously retained for a long period. Thus, for example, when the OS transistor is used as a transistor provided in a memory circuit, analog data written to the memory circuit can be continuously retained for a long period.

Part of each of the memory circuit 23M, the memory circuit 25M, the memory circuit 26M, the memory circuit 27M, and the memory circuit 28M can be formed using an OS transistor (see FIG. 2E or FIG. 2F). Thus, part of each of the memory circuit 23M, the memory circuit 25M, the memory circuit 26M, the memory circuit 27M, and the memory circuit 28M can be provided in the memory portion 11 of the layer 30.

The power supply control switches of the display portion driver circuit 23, the image processing circuit 25, the sensor circuit 26, the communication circuit 27, and the input/output circuit 28 can be formed using OS transistors, for example. Thus, the power supply control switches can be provided in the layer 30.

The image processing circuit 25 has a function of processing image data. For example, the image processing circuit 25 may include a super-resolution circuit and have a function of performing upconversion or downconversion of image data.

For example, the control circuit 22 has a function of controlling the operation of the functional circuit 21 provided in the layer 20 on the basis of a signal from the image processing circuit 25. For example, the control circuit 22 may have a function of controlling whether power is supplied to each of the display portion driver circuit 23, the image processing circuit 25, the sensor circuit 26, the communication circuit 27, and the input/output circuit 28 included in the functional circuit 21.

The display portion driver circuit 23 is electrically connected to the display portion 31 included in the layer 30 and has a function of supplying image data to the display portion 31. A variety of circuits such as a shift register, a level shifter, an inverter, a latch, an analog switch, and a logic circuit can be used as the display portion driver circuit 23.

The layer 60 is provided to overlap with the display portion 31 included in the layer 30. The layer 60 includes a plurality of light-emitting elements, and the emission luminance is controlled by the pixel circuit 51 provided in the display portion 31. Thus, the layer 60 can also be regarded as part of the display portion 31.

The display portion 31 includes a pixel 50. The pixel 50 includes a plurality of pixel circuits 51 and light-emitting elements (not illustrated) provided in the layer 60 over the pixel circuits 51. The pixel circuits 51 correspond to pixel circuits included in sub-pixels for performing color display.

Note that three sub-pixels control the emission amounts or the like of red light, green light, and blue light. The light colors controlled by the three subpixels are not limited to a combination of red (R), green (G), and blue (B) and may be a combination of cyan (C), magenta (M), and yellow (Y). In addition, each of the three subpixels do not necessarily have the same area. For example, in the case where luminous efficiency, reliability, or the like varies depending on the emission color, the subpixel area may be changed depending on the emission color.

Four subpixels may collectively function as one pixel. For example, a subpixel that controls the emission amount of white light may be added to the three subpixels that control the emission amounts of red light, green light, and blue light. The addition of the subpixel that controls the emission amount of white light can increase the luminance of a display region. Alternatively, a subpixel that controls the emission amount of yellow light may be added to the three subpixels that control the emission amounts of red light, green light, and blue light. Alternatively, a subpixel that controls the emission amount of white light may be added to the three subpixels that control the emission amounts of cyan light, magenta light, and yellow light.

When the number of subpixels functioning as one pixel is increased and a subpixel that controls the emission amount of light of red, green, blue, cyan, magenta, yellow, or the like is used appropriately in combination, the reproducibility of halftones can be increased. Thus, color reproducibility can be increased.

The sensor circuit 26 has a function of obtaining information on one or more of the senses of sight, hearing, touch, taste, and smell of a human, for example. Specifically, for example, the sensor circuit 26 has a function of sensing or measuring one or more of the following: force, displacement, position, speed, acceleration, angular velocity, rotational frequency, distance, light, magnetism, temperature, sound, time, electric field, current, voltage, power, radiation, humidity, gradient, oscillation, smell, and infrared rays. The sensor circuit 26 may have a function other than those functions.

The communication circuit 27 has a function of communicating with other terminals by wire or wirelessly. In particular, the communication circuit 27 preferably has a wireless communication function, in which case the number of parts such as a connection cable can be decreased.

The input/output circuit 28 has a function of distributing signals supplied to the display apparatus 300A through the terminal portion 29, to circuits such as the control circuit 22, for example. The input/output circuit 28 also has a function of distributing a signal supplied to the display apparatus 300A through the communication circuit 27 to circuits such as the control circuit 22, for example. The input/output circuit 28 has a function of outputting signals to the outside through the terminal portion 29. The input/output circuit 28 has function of outputting signals to the outside through the communication circuit 27.

An FPC (Flexible Printed Circuits) or the like is electrically connected to the terminal portion 29, for example. Thus, the layer 30 and the sealing substrate 40 are not formed in a region overlapping with the terminal portion 29.

The functional circuit 21 can perform power gating at fine granularity. That is, in accordance with the processing performed in the functional circuit 21, each circuit (the display portion driver circuit 23, the image processing circuit 25, the sensor circuit 26, the communication circuit 27, and the input/output circuit 28) included in the functional circuit 21 can be individually controlled to be in an active state or a power gated state by the control circuit 22.

For example, in the case where processing of image data is executed, setting information of the image processing circuit 25 can be read from the memory circuit 25M, and the image processing circuit 25 is brought into an active state, whereby the processing of the image data can be immediately executed without the initialization processing. Furthermore, the display portion driver circuit 23, the sensor circuit 26, the communication circuit 27, and the input/output circuit 28 that do not directly contribute to the processing of image data are brought into a power gated states, whereby power consumption can be reduced.

Structure Example 2

Figure 8A:
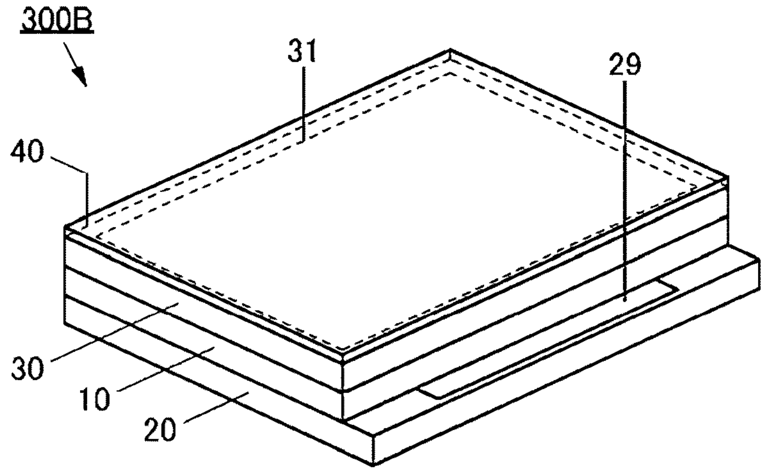
FIG. 8A and FIG. 8B are diagrams each illustrating a structure example of a display apparatus.
Figure 8B:
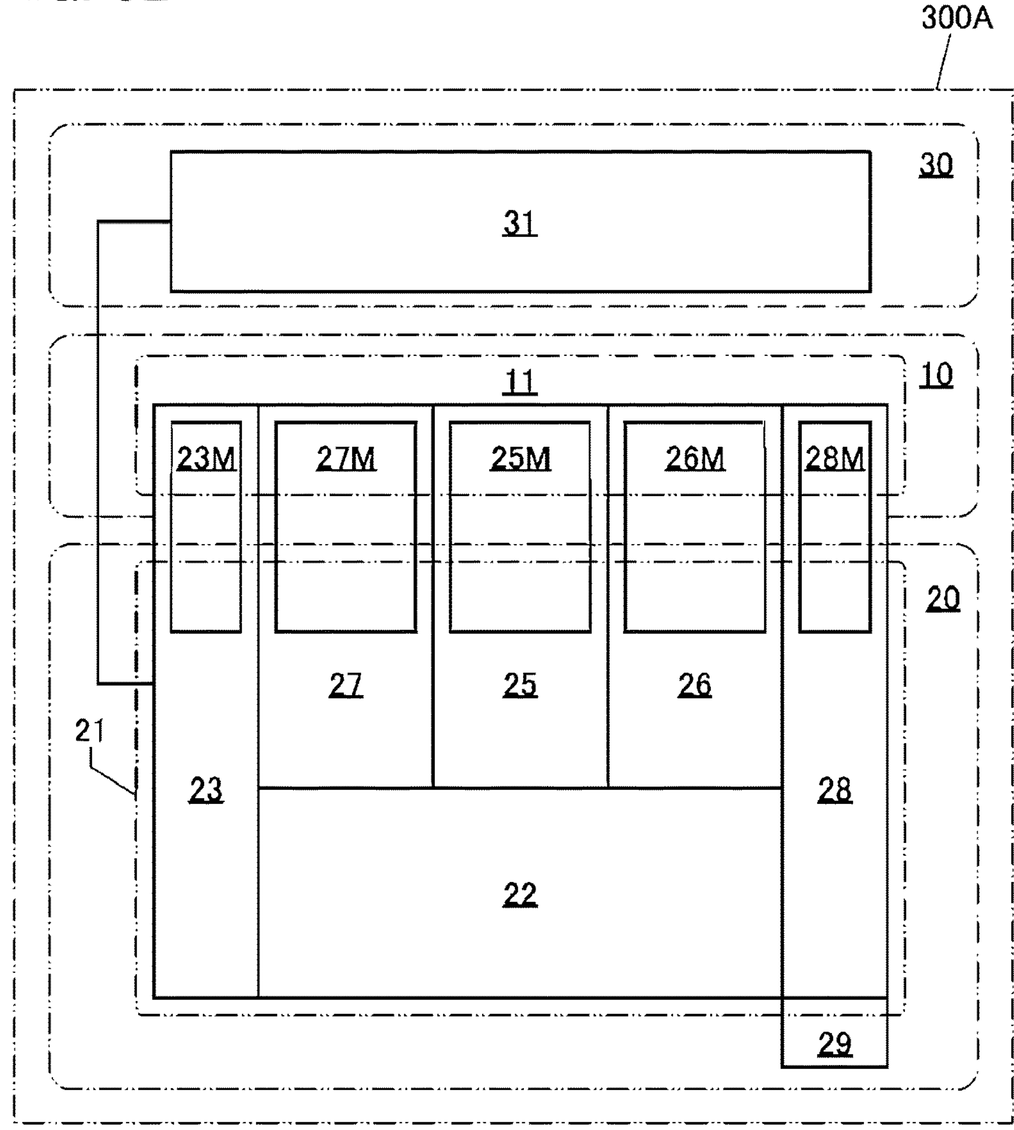
Figure 9:
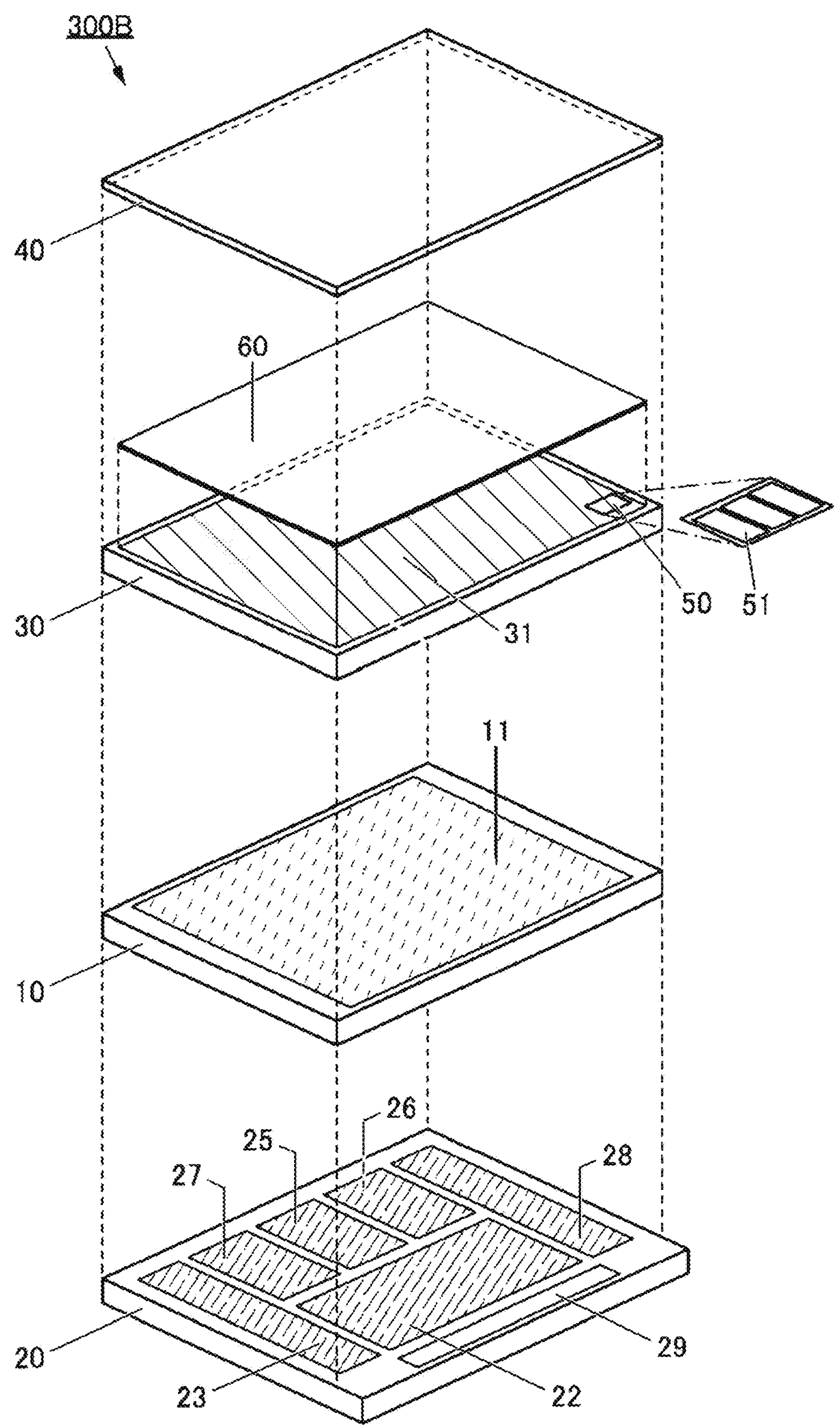
FIG. 9 is a diagram illustrating a structure example of a display apparatus.

Another structure example of the display apparatus according to one embodiment of the present invention will be described. FIG. 8A and FIG. 9 are perspective views of a display apparatus 300B of one embodiment of the present invention. FIG. 8B is a block diagram illustrating a structure of the display apparatus 300B. The display apparatus 300B includes the layer 10 over the layer 20, the layer 30 over the layer 10, and the sealing substrate 40 over the layer 30. The layer 30 includes the display portion 31, and the layer 60 is provided between the sealing substrate 40 and the display portion 31. The layer 10 includes the memory portion 11. In FIG. 9, in order to elucidate the structure of the display apparatus 300B, for example, the layer 20, the layer 30, the layer 60, the sealing substrate 40, and the like are illustrated separately.

Note that repeated description of components denoted by the same reference numerals as those in the display apparatus 300A illustrated in FIG. 6 and FIG. 7 is omitted in some cases.

Since the layer 20 is similar to the layer 20 included in the display apparatus 300A, the description of Structure Example 1 described above can be referred to as appropriate.

The memory portion 11 provided in the layer 10 includes at least part of the memory circuit 23M, the memory circuit 25M, the memory circuit 26M, the memory circuit 27M, and the memory circuit 28M. The layer 10 can include a power supply control switch (not illustrated). In the structure of the display apparatus 300B, the memory portion 11 and the power supply control switch are provided in the layer 10, and the display portion 31 is provided in the layer 30 that is different from the layer 10. Therefore, the display portion 31 of the display apparatus 300B can have a larger area than that of the display apparatus 300A. Note that both the layer 10 and the layer 30 can include OS transistors.

As described above, the display apparatus 300B of one embodiment of the present invention has a structure in which a layer including the display portion 31, a layer including the memory portion 11 and the power supply control switch, and a layer including the functional circuit 21 are stacked. Stacking layers provided with the circuits can reduce the size of the display apparatus 300B. In addition, since the display portion driver circuit 23 can be provided to overlap with the display portion 31, the area of the display portion 31 can be enlarged. Thus, the definition of the display portion 31 can be increased, so that the display quality of the display apparatus 300B can be increased.

Furthermore, stacking the layer including the display portion 31, the layer including the memory portion 11 and the power supply control switch, and the layer including the functional circuit 21 can shorten wirings that electrically connect them to one another. Thus, the wiring resistance and the parasitic capacitance can be reduced, and the operation speed of the display apparatus 300B can be increased. Furthermore, power consumption of the display apparatus 300B is reduced.

At least part of the structure examples, the drawings corresponding thereto, and the like described in this embodiment can be combined with the other structure examples, the other drawings, and the like as appropriate.

Embodiment 3

In this embodiment, a metal oxide (hereinafter also referred to as an oxide semiconductor) that can be used for the OS transistor described in the above embodiment will be described.

The metal oxide used for the OS transistor preferably contains at least indium or zinc, and further preferably contains indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and is further preferably gallium.

For example, the metal oxide can be formed by a sputtering method, a chemical vapor deposition (CVD) method such as a metal organic chemical vapor deposition (MOCVD) method, an atomic layer deposition (ALD) method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Amorphous (including completely amorphous), CAAC (c-axis-aligned crystalline), nc (nanocrystalline), CAC (cloud-aligned composite), single crystal, and polycrystalline (poly crystal) structures, and the like can be given as examples of a crystal structure of an oxide semiconductor.

Note that a crystal structure of a film or a substrate can be evaluated with an X-ray diffraction (XRD) spectrum. For example, evaluation is possible using an XRD spectrum that is obtained by GIXD (Grazing-Incidence XRD) measurement. Note that a GIXD method is also referred to as a thin film method or a Seemann-Bohlin method. Hereinafter, an XRD spectrum obtained from GIXD measurement is simply referred to as an XRD spectrum in some cases.

For example, the XRD spectrum of a quartz glass substrate shows a peak with a substantially bilaterally symmetrical shape. On the other hand, the peak of the XRD spectrum of the In—Ga—Zn oxide film having a crystal structure has a bilaterally asymmetrical shape. The bilaterally asymmetrical peak of the XRD spectrum clearly shows the existence of crystals in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film deposited at room temperature.

Thus, the In—Ga—Zn oxide film deposited at room temperature is in an intermediate state, which is neither a single crystal nor polycrystal nor an amorphous state. Therefore, it is difficult to conclude that In—Ga—Zn oxide film is in an amorphous state.

[Structure of Oxide Semiconductor]

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the CAAC-OS and the nc-OS. Other examples of the non-single-crystal oxide semiconductors include a polycrystalline oxide semiconductor, an amorphous-like oxide semiconductor (a-like OS), and an amorphous oxide semiconductor.

Here, the CAAC-OS, the nc-OS, and the a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. Note that when an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the orientation of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a plurality of minute crystals, the maximum diameter of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga, Zn) layer) are stacked. Note that indium and gallium can be replaced with each other. Therefore, indium may be contained in the (Ga, Zn) layer. In addition, gallium may be contained in the In layer. Note that zinc may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS, for example.

For example, a plurality of bright spots are observed in the electron diffraction pattern of the CAAC-OS film. Note that one spot and another spot are observed point-symmetrically with a spot of an incident electron beam passing through a sample (also referred to as a direct spot) as a symmetric center.

When the crystal region is observed from the particular direction, a lattice arrangement in the crystal region is basically a hexagonal lattice arrangement; however, a unit lattice is not always a regular hexagon and is a non-regular hexagon in some cases. For example, a pentagonal lattice arrangement, a heptagonal lattice arrangement, and the like are included in the distortion in some cases. Note that it is difficult to observe a clear grain boundary even in the vicinity of distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure where a clear grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, it can be said that a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm).

Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and smaller than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has a higher hydrogen concentration in the film than the nc-OS and the CAAC-OS.

[Structure of Oxide Semiconductor]

Next, the above-described CAC-OS will be described in detail. Note that the CAC-OS relates to the material composition.

[CAC-OS]

The CAC-OS refers to one composition of a material in which elements included in a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide is a region having [In] higher than [In] in the composition of the CAC-OS film. Moreover, the second region is a region having [Ga] higher than [Ga] in the composition of the CAC-OS film. Alternatively, for example, the first region is a region having [In] higher than [In] in the second region and [Ga] lower than [Ga] in the second region. Moreover, the second region is a region having [Ga] higher than [Ga] in the first region and [In] lower than [In] in the first region.

Specifically, the first region includes indium oxide, indium zinc oxide, or the like as its main component, for example. The second region includes gallium oxide, gallium zinc oxide, or the like as its main component, for example. That is, the first region can be rephrased as a region containing In as its main component. The second region can be rephrased as a region containing Ga as its main component.

Note that in some cases, it is difficult to observe a clear boundary between the first region and the second region.

In addition, in a material composition of a CAC-OS in an In—Ga—Zn oxide that contains In, Ga, Zn, and O, there are regions containing Ga as a main component in part of the CAC-OS and regions containing In as a main component in another part of the CAC-OS. These regions each form a mosaic pattern and are randomly present. Thus, it is suggested that the CAC-OS has a structure where metal elements are unevenly distributed.

The CAC-OS can be formed by a sputtering method under a condition where a substrate is not heated intentionally, for example. Furthermore, in the case where the CAC-OS is formed by a sputtering method, any one or more selected from an inert gas (typically, argon), an oxygen gas, and a nitrogen gas is used as a deposition gas. The proportion of the flow rate of an oxygen gas in the total flow rate of the deposition gas during deposition is preferably as low as possible. For example, the proportion of the flow rate of an oxygen gas in the total flow rate of the deposition gas during deposition is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure where the region containing In as its main component (the first region) and the region containing Ga as its main component (the second region) are unevenly distributed and mixed.

Here, the first region is a region having higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

The second region is a region having a higher insulating property than the first region. In other words, when the second regions are distributed in a metal oxide, leakage current can be inhibited.

Thus, in the case where the CAC-OS is used for a transistor, a switching function (on state/off state switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when a CAC-OS is used for a transistor, high on-state current ($I_{on}$), a high field-effect mobility (μ), and favorable switching operation can be achieved.

A transistor using the CAC-OS has high reliability. Thus, the CAC-OS is most suitable for a variety of semiconductor devices such as a display apparatus.

An oxide semiconductor has various structures with different properties. Two or more kinds among an amorphous oxide semiconductor, a polycrystalline oxide semiconductor, an a-like OS, a CAC-OS, an nc-OS, and a CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor with high reliability can be achieved.

It is particularly preferable to use an oxide containing indium (In), gallium (Ga), and zinc (Zn) (also referred to as "IGZO") for the semiconductor layer where a channel is formed. Alternatively, an oxide containing indium (In), aluminum (Al), and zinc (Zn) (also referred to as "IAZO") may be used for the semiconductor layer. Further alternatively, an oxide containing indium (In), aluminum (Al), gallium (Ga), and zinc (Zn) (also referred to as "IAGZO") may be used for the semiconductor layer.

An oxide semiconductor having a low carrier concentration is preferably used for a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration in an oxide semiconductor, the impurity concentration in the oxide semiconductor is reduced so that the density of defect states in the oxide semiconductor can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that an impurity in an oxide semiconductor refers to, for example, elements other than the main components of the oxide semiconductor. For example, an element with a concentration lower than 0.1 atomic % can be regarded as an impurity.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon (the concentration obtained by secondary ion mass spectrometry (SIMS)) in the semiconductor layer is set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. For this reason, hydrogen in the oxide semiconductor is preferably reduced as much as possible. Specifically, the concentration of hydrogen in the oxide semiconductor, which is measured by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

The structures and the like described in this embodiment can be used in appropriate combination with any of the structures and the like described in the other embodiments and the like.

Embodiment 4

In this embodiment, electronic devices in which the semiconductor device of one embodiment of the present invention can be used will be described.

The semiconductor device of one embodiment of the present invention can be used for a display portion of an electronic device. Thus, one embodiment of the present invention can achieve an electronic device having high display quality. Another embodiment of the present invention can achieve an electronic device with extremely high definition. Another embodiment of the present invention can achieve a highly reliable electronic device.

Examples of electronic devices using the semiconductor device or the like of one embodiment of the present invention include display apparatuses such as televisions and monitors, lighting devices, desktop or laptop personal computers, word processors, image reproduction devices that reproduce still images and moving images stored in recording media such as DVDs (Digital Versatile Discs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as chain saws, smoke detectors, and medical equipment such as dialyzers. Other examples include industrial equipment such as guide lights, traffic lights, belt conveyors, elevators, escalators, industrial robots, power storage systems, and power storage devices for leveling the amount of power supply and smart grid. In addition, moving objects and the like driven by fuel engines and electric motors using power from power storage units may also be included in the category of electronic devices. Examples of the moving objects include electric vehicles (EVs), hybrid electric vehicles (HVs) that include both an internal-combustion engine and a motor, plug-in hybrid electric vehicles (PHVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The electronic device of one embodiment of the present invention may include a secondary battery (battery), and furthermore, it is preferable that the secondary battery be capable of being charged by contactless power transmission.

Examples of the secondary battery include a lithium-ion secondary battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display images, information, and the like on a display portion. When the electronic device includes an antenna and a secondary battery, the antenna may be used for contactless power transmission.

The electronic device of one embodiment of the present invention may include a sensor (e.g., a sensor having a function of measuring force, displacement, position, speed, acceleration, angular velocity, rotational frequency, distance, light, liquid, magnetism, temperature, a chemical substance, sound, time, hardness, an electric field, current, voltage, power, radiation, a flow rate, humidity, gradient, oscillation, a smell, infrared rays, or the like).

The electronic device of one embodiment of the present invention can have a variety of functions. For example, the electronic device can have a function of displaying a variety of information (e.g., a still image, a moving image, a text image, and the like) on the display portion, a touch panel function, a function of displaying a calendar, date, time, and the like, a function of executing a variety of software (programs), a wireless communication function, and a function of reading a program or data stored in a recording medium.

Furthermore, an electronic device including a plurality of display portions can have a function of displaying image information mainly on one display portion while displaying text information mainly on another display portion, a function of displaying a three-dimensional image by displaying images on the plurality of display portions with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display portion, or the like. Note that the functions of the electronic device of one embodiment of the present invention are not limited to these. The electronic device of one embodiment of the present invention can have a variety of functions.

The semiconductor device of one embodiment of the present invention can display a high-definition image. Thus, the semiconductor device can be suitably used especially for a portable electronic device, a wearable electronic device (wearable device), an e-book reader, or the like. For example, the semiconductor device can be suitably used for xR devices such as a VR device and an AR device.

Figure 10A:
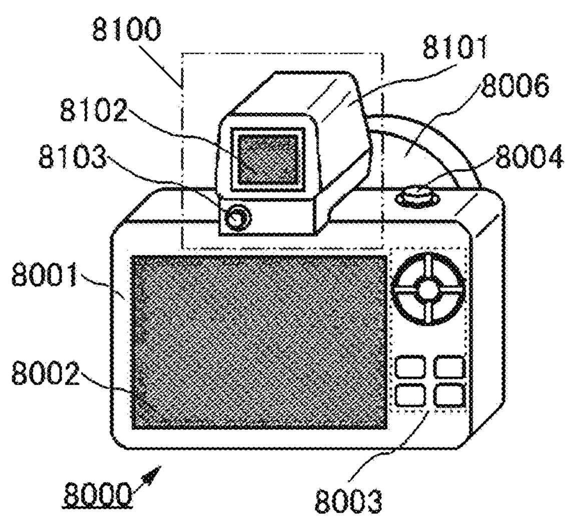
FIG. 10A to FIG. 10F are diagrams each illustrating an example of an electronic device.

FIG. 10A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing, for example.

The finder 8100 includes a housing 8101, a display portion 8102, a button 8103, and the like.

The housing 8101 is attached to the camera 8000 by a mount for engagement with the mount of the camera 8000. The finder 8100 can display an image and the like received from the camera 8000 on the display portion 8102, for example.

The button 8103 functions as a power button or the like, for example.

The semiconductor device of one embodiment of the present invention can be used in the display portion 8002 of the camera 8000 and the display portion 8102 of the finder 8100. Note that the finder 8100 may be incorporated in the camera 8000.

Figure 10B:
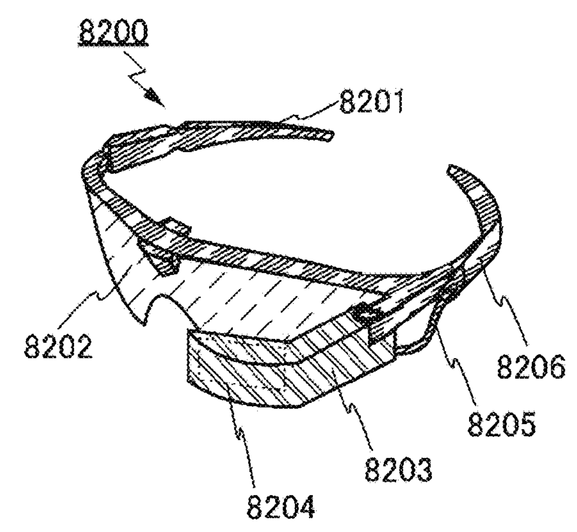

FIG. 10B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 has a function of supplying power from the battery 8206 to the main body 8203. The main body 8203 includes a wireless receiver or the like to receive image information and display it on the display portion 8204, for example. The main body 8203 includes a camera, and information on the movement of the eyeballs or the eyelids of the user can be used as an input means, for example.

The mounting portion 8201 may include a plurality of electrodes capable of sensing current flowing in response to the movement of the user's eyeball at a position in contact with the user to recognize the user's sight line. The mounting portion 8201 may also have a function of monitoring the user's pulse with the use of current flowing through the electrodes. The mounting portion 8201 may include a variety of sensors such as a temperature sensor, a pressure sensor, and an acceleration sensor. The head-mounted display 8200 may have a function of displaying the user's biological information on the display portion 8204, a function of changing an image displayed on the display portion 8204 in response to the movement of the user's head, or the like.

The semiconductor device of one embodiment of the present invention can be used in the display portion 8204.

Figure 10C:
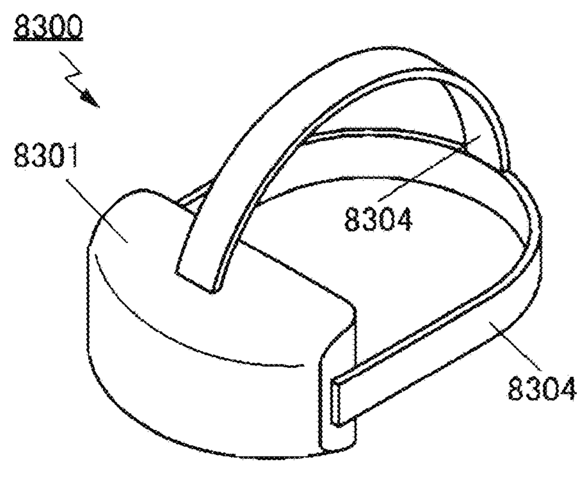
Figure 10D:
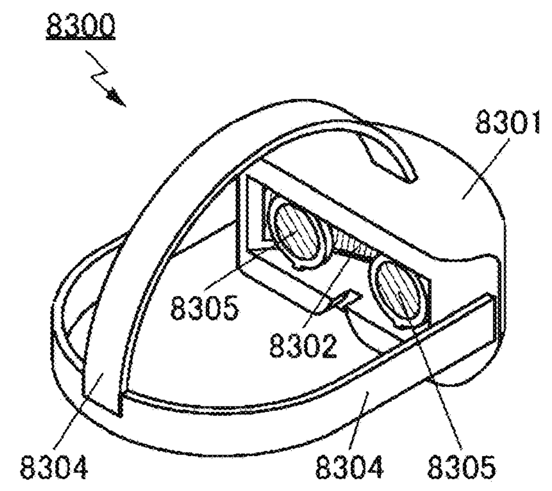
Figure 10E:
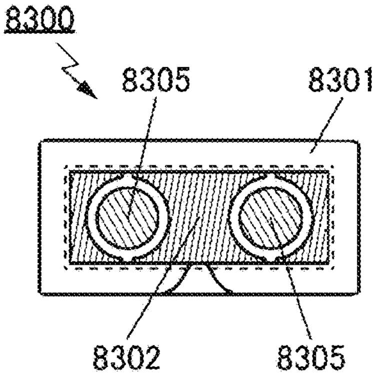

FIG. 10C to FIG. 10E are external views of a head-mounted display 8300. The head-mounted display 8300 includes a housing 8301, a display portion 8302, a band-like fixing member 8304, and a pair of lenses 8305.

A user can see display on the display portion 8302 through the lenses 8305. In the head-mounted display 8300, the display portion 8302 is preferably curved because the user can feel a high realistic sensation. For example, another image displayed on another region of the display portion 8302 is viewed through the lenses 8305, so that three-dimensional display using parallax or the like can be performed. Note that the number of display portions 8302 is not limited to one; for example, two display portions 8302 may be provided for the user's respective eyes.

The semiconductor device of one embodiment of the present invention can be used for the display portion 8302. The semiconductor device of one embodiment of the present invention can achieve extremely high definition. For example, a pixel is not easily seen by the user even when the user sees display that is magnified by the lenses 8305 as illustrated in FIG. 10E. That is, an image with a strong sense of reality can be seen by the user with the use of the display portion 8302.

Figure 10F:
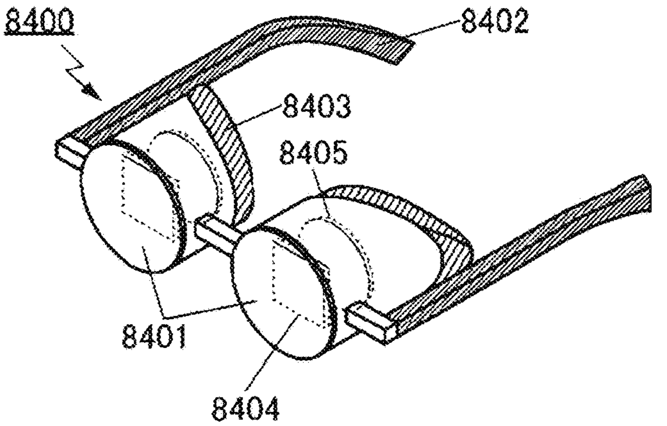

FIG. 10F is an external view of a goggle-type head-mounted display 8400. The head-mounted display 8400 includes a pair of housings 8401, a mounting portion 8402, and a cushion 8403. A display portion 8404 and a lens 8405 are provided in the pair of housings 8401 each. Furthermore, when the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has plasticity and elasticity so as to be adjusted to fit the size of the user's face and not to slide down. In addition, part of the mounting portion 8402 preferably has a vibration mechanism functioning as a bone conduction earphone, for example. Thus, a separate audio device such as an earphone or a speaker is not needed, and the user can enjoy images and sounds only by wearing the head-mounted display. Note that the housing 8401 may have a function of outputting sound data by wireless communication, for example.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used for example, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

The semiconductor device of one embodiment of the present invention can be used in the display portion 8404.

FIG. 11A illustrates an example of a television device. In a television device 7100, a display portion 7000 is incorporated in a housing 7101. Here, the housing 7101 is supported by a stand 7103.

The semiconductor device of one embodiment of the present invention can be used for the display portion 7000 in FIG. 11A.

Operation of the television device 7100 illustrated in FIG. 11A can be performed with an operation switch provided in the housing 7101 or a separate remote controller 7111.

Furthermore, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and images displayed on the display portion 7000 can be operated in the television device 7100.

Note that the television device 7100 has a structure in which a receiver, a modem, and the like are provided, for example. A general television broadcast can be received with the receiver. When the television device is connected to a communication network with or without wires via the modem, one-way (e.g., from a transmitter to a receiver) or two-way (between a transmitter and a receiver or between receivers, for example) information communication can be performed.

FIG. 11B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The semiconductor device of one embodiment of the present invention can be used for the display portion 7000 in FIG. 11B.

FIG. 11C and FIG. 11D illustrate examples of digital signage.

Digital signage 7300 illustrated in FIG. 11C includes a housing 7301, the display portion 7000, a speaker 7303, and the like. The digital signage 7300 can also include an LED lamp, an operation key (including a power switch or an operation switch), a connection terminal, a variety of sensors, a microphone, or the like.

FIG. 11D illustrates digital signage 7400 attached to a cylindrical pillar. The digital signage 7400 includes the display portion 7000 provided along a curved surface of the pillar 7401.

In FIG. 11C and FIG. 11D, the semiconductor device of one embodiment of the present invention can be used for the display portion 7000.

The digital signage 7300 or the digital signage 7400 including a larger area of the display portion 7000 can increase the amount of information that can be provided at a time.

The larger display portion 7000 attracts more attentions, so that the effectiveness of the advertisement can be increased, for example.

The digital signage 7300 or the digital signage 7400 preferably includes a touch panel in the display portion 7000. This enables intuitive operation by a user, in addition to display of a still image or a moving image on the display portion 7000. Moreover, for an application that provides information such as route information or traffic information, usability can be enhanced by intuitive operation.

As illustrated in FIG. 11C and FIG. 11D, it is preferable that the digital signage 7300 or the digital signage 7400 be capable of working with an information terminal 7311 or an information terminal 7411 such as a smartphone a user has through wireless communication, for example. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

FIG. 11E illustrates an example of an information terminal. An information terminal 7550 includes a housing 7551, a display portion 7552, a microphone 7557, a speaker portion 7554, a camera 7553, operation switches 7555, and the like. The semiconductor device of one embodiment of the present invention can be used for the display portion 7552. The display portion 7552 can have a touch panel function. The information terminal 7550 also includes an antenna, a battery, and the like inside the housing 7551. The information terminal 7550 can be used as, for example, a smartphone, a mobile phone, a tablet information terminal, a tablet personal computer, an e-book reader, or the like.

FIG. 11F illustrates an example of a watch-type information terminal. An information terminal 7660 includes a housing 7661, a display portion 7662, a band 7663, a buckle 7664, an operation switch 7665, an input/output terminal 7666, and the like. The semiconductor device of one embodiment of the present invention can be used for the display portion 7662. The information terminal 7660 also includes, for example, an antenna, a battery, and the like inside the housing 7661. The information terminal 7660 is capable of executing a variety of applications such as mobile phone calls, e-mailing, text viewing and editing, music reproduction, Internet communication, and computer games, for example.

The information terminal 7660 includes a touch sensor in the display portion 7662, and can be operated by touching the screen with a finger, a stylus, or the like. For example, by touching an icon 7667 displayed on the display portion 7662, an application can be started. With the operation switch 7665, for example, a variety of functions such as time setting, power on/off, on/off of wireless communication, setting or cancellation of a silent mode, and setting or cancellation of a power saving mode can be performed. For example, the functions of the operation switch 7665 can be set by the operating system incorporated in the information terminal 7660.

The information terminal 7660 can execute near field communication conformable to a communication standard. For example, mutual communication between the information terminal 7660 and a headset capable of wireless communication enables hands-free calling. The information terminal 7660 can perform data transmission and reception with another information terminal through the input/output terminal 7666. Charging through the input/output terminal 7666 is also possible. Note that the charging operation may be performed by wireless power feeding without using the input/output terminal 7666.

Figure 12A:
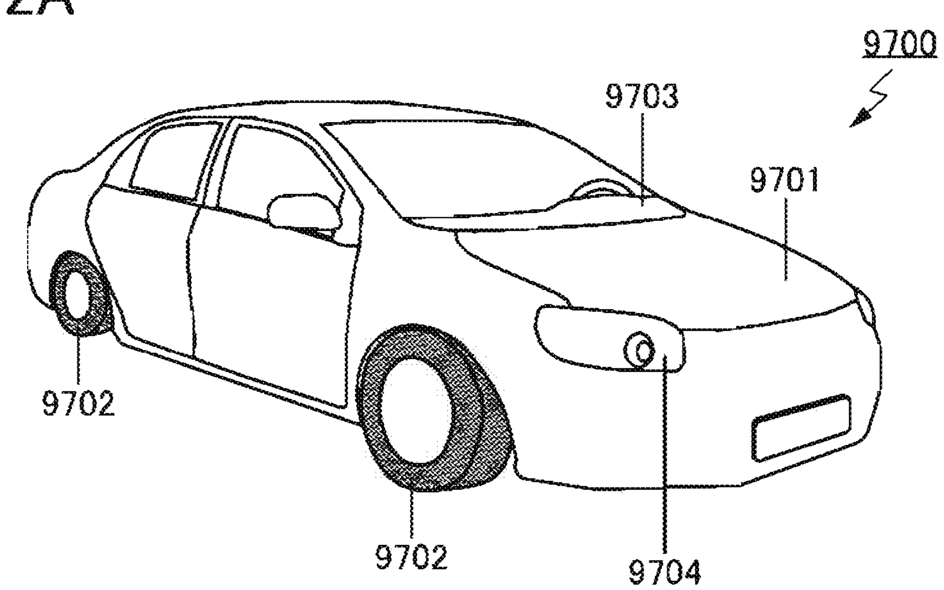
FIG. 12A and FIG. 12B are diagrams each illustrating an example of an electronic device.
Figure 12B:
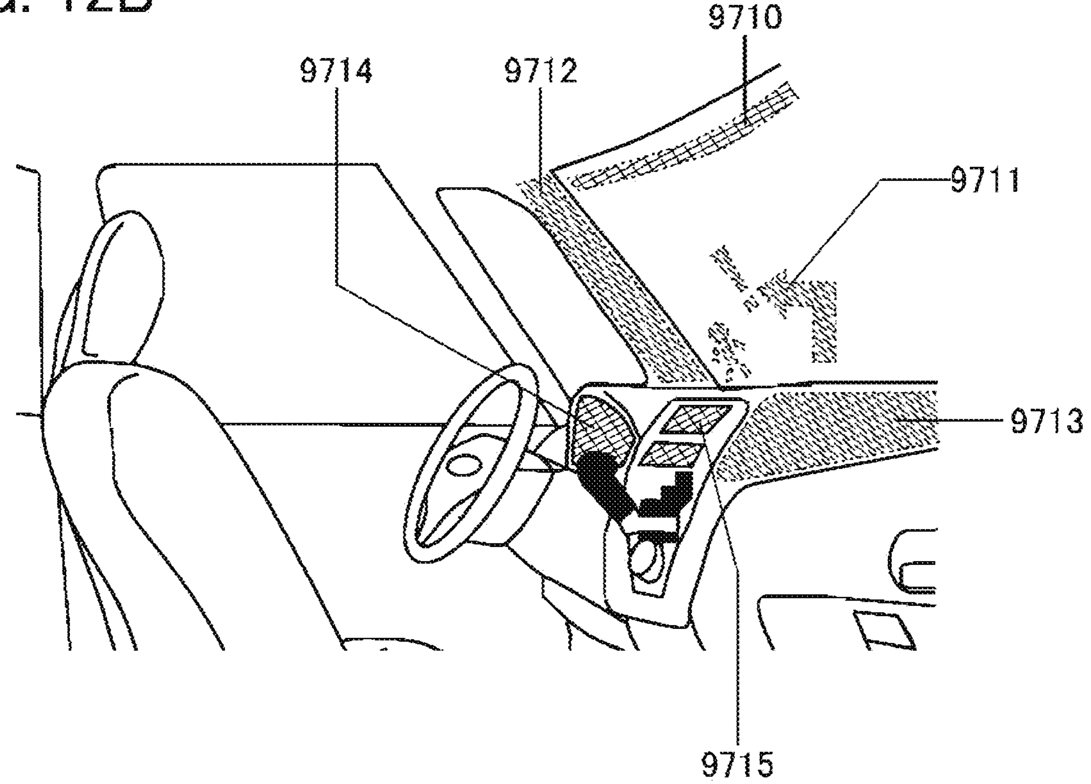

FIG. 12A is an external view of an automobile 9700. FIG. 12B illustrates a driver's seat of the automobile 9700. The automobile 9700 includes a car body 9701, wheels 9702, a dashboard 9703, lights 9704, and the like. The display apparatus of one embodiment of the present invention can be used in a display portion of the automobile 9700 or the like. For example, the display apparatus of one embodiment of the present invention can be provided for a display portion 9710 to a display portion 9715 illustrated in FIG. 12B.

The display portion 9710 and the display portion 9711 are display apparatuses provided in an automobile windshield. The display apparatus of one embodiment of the present invention can be what is called a see-through display apparatus, through which the opposite side can be seen, by using a light-transmitting conductive material for electrodes of the display apparatus. Such a see-through display apparatus does not hinder driver's vision during the driving of the automobile 9700. Thus, the display apparatus of one embodiment of the present invention can be provided in the windshield of the automobile 9700. Note that in the case where a transistor or the like for driving the display apparatus is provided in the display apparatus, for example, a transistor having a light-transmitting property, such as an organic transistor using an organic semiconductor material or a transistor using an oxide semiconductor, is preferably used as the transistor.

The display portion 9712 is a display apparatus provided on a pillar portion. For example, the display portion 9712 can compensate for the view hindered by the pillar by displaying an image taken by an imaging means provided on the car body 9701. The display portion 9713 is a display apparatus provided on a dashboard 9703. For example, the display portion 9713 can compensate for the view hindered by the dashboard 9703 by displaying an image taken by the imaging means provided on the car body 9701. That is, in the automobile 9700, an image taken by the imaging means provided on the car body 9701 is displayed on the display portion 9712 and the display portion 9713, which can compensate for blind areas and enhance safety. Display of an image that complements for a portion that cannot be seen makes it possible to confirm safety more naturally and comfortably.

Figure 13:
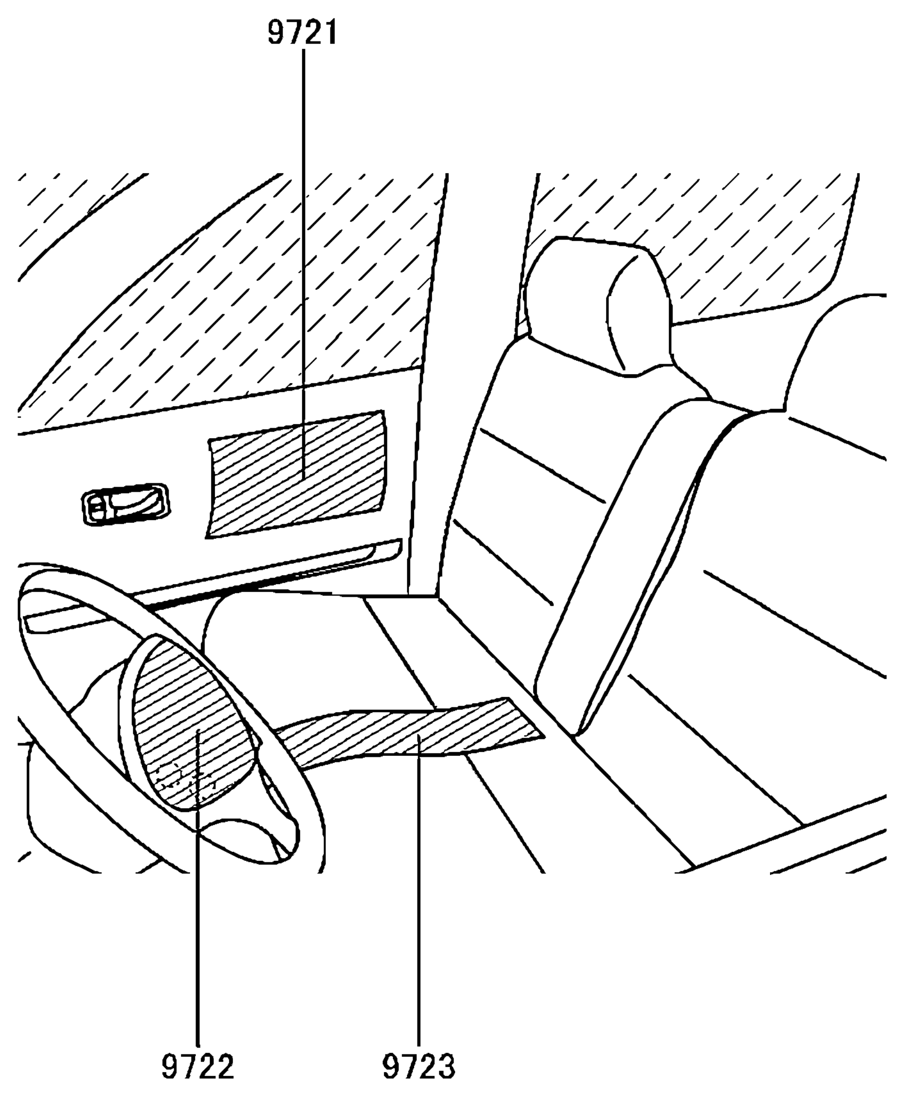
FIG. 13 is a diagram illustrating an example of an electronic device.

FIG. 13 illustrates the inside of an automobile 9700 in which a bench seat is used as a driver's seat and a front passenger's seat. A display portion 9721 is a display apparatus provided in a door portion. For example, the display portion 9721 can compensate for the view hindered by the door by displaying an image taken by an imaging means provided on the car body 9701. A display portion 9722 is a display apparatus provided in a steering wheel. A display portion 9723 is a display apparatus provided in the middle of a seating face of the bench seat. The display apparatus of one embodiment of the present invention can be provided for each of the display portion 9721 to the display portion 9723.

The display portion 9714, the display portion 9715, and the display portion 9722 can provide a variety of kinds of information to a user by displaying navigation information, speed, the number of engine revolutions, a mileage, the remaining amount of fuel, a gearshift state, air-condition setting, or the like. The content, layout, and the like of the display on the display portions can be changed freely by a user as appropriate. The above information can also be displayed on one or more of the display portion 9710 to the display portion 9713, the display portion 9721, and the display portion 9723. One or more of the display portion 9710 to the display portion 9715 and the display portion 9721 to the display portion 9723 can also be used as lighting devices.

The structures and the like described in this embodiment can be used in appropriate combination with any of the structures and the like described in the other embodiments and the like.

EXAMPLE

In this example, an MCU that was actually designed will be described. For example, the MCU can be suitably used for xR devices such as a VR device and an AR device. The semiconductor device of one embodiment of the present invention can be suitably used for the MCU described in this example.

Table 1 is a table showing modules included in the designed MCU and some of the functions of the designed MCU.

TABLE 1

| Classification | | Name |
|---|---|---|
| Digital | CPU core | Arm ® Cortex ®-MO |
| | System bus | AMBA AHB |
| | | AMBA APB |
| | | PCI |
| | Clock control | RCC |
| | Power management | PMU |
| | Interface | System controller |
| | | Default slave |
| | | Independent interface |
| | | GPIO |
| | | DMA |
| | | Timer |
| | | UART |
| | | PCI |
| | | I2C |
| | | SPI |
| Analog | Clock generation | Multiplication circuit/Divider circuit |

TABLE 1-continued

| Classification | | Name |
|---|---|---|
| | Power supply circuit | Power switch |
| | ADC | 12 bit |
| Memory | SRAM | With ECC |
| | NOSRAM ® | |
| Others | Debug circuit | CORE |
| | (Scan chain) | Peripheral |
| | Soft-error countermeasure | Triple Modular Redundancy |
| | Power gating | For the whole MCU |
| | | For each module |

The designed MCU employs Arm (registered trademark) Cortex (registered trademark)-M0 as a CPU core. As a system bus, an AHB (Advanced High-performance Bus) and an APB (Advanced Peripheral Bus) of an AMBA (Advanced Microcontroller Bus Architecture), and a PCI (Peripheral Component Interconnect) are employed. In addition, functions of clock control (RCC: Reset and Clock Control) and power management (PMU: Power Management Unit) are incorporated. As an interface, a system controller, a default slave, an independent interface, a GPIO (General Purpose Input/Output), a DMA (Direct Memory Access), a timer, a UART (Universal Asynchronous Receiver Transmitter), the PCI (Peripheral Component Interconnect), an I2C (Inter-Integrated Circuit), and an SPI (Serial Peripheral Interface) are incorporated. Furthermore, clock generation due to a multiplication circuit and a divider circuit, a power supply circuit with a power switch, and a 12 bit ADC (Analog to Digital Converter) are incorporated. Furthermore, an SRAM (Static Random Access Memory) with an ECC (Error Check and Correct), and a NOSRAM (registered trademark) are incorporated. Note that a DRAM (Dynamic Random Access Memory) may be incorporated. Furthermore, a debug circuit of the CPU core and the peripheral circuit due to the scan chain and a function of Triple Modular Redundancy (TMR) of a flip-flop as a soft-error countermeasure are incorporated. Note that a bit-interleaving function and a function of a memory scrubbing may be incorporated. Furthermore, functions of performing power gating for the whole MCU and power gating for each module (power gating at fine granularity) are incorporated.

Note that the structure of the semiconductor device 100 of one embodiment of the present invention can be suitably used for the designed MCU. That is, for example, the PMU included in the designed MCU can correspond to the instruction portion 102 included in the semiconductor device 100, and the modules such as the CPU core, the memory, and the interface can correspond to the components included in the semiconductor device 100, for example.

Then, for example, when arithmetic processing is performed using the CPU core, bringing the modules of the interface into a power gated state can reduce power consumption of the interface. For example, when data transfer by the DMA is performed, bringing the modules of the interface other than the CPU core and the DMA in a power gated state can reduce power consumption of the module of the interface. Accordingly, low power consumption of the designed MCU can be achieved.

In addition, for example, when a state in which the arithmetic processing is performed by the CPU core is shifted to a state in which data transfer is performed by the DMA, the data transfer performed by the DMA can be executed immediately. For example, when the state in which data transfer is performed by the DMA is shifted to the state in which the arithmetic processing is performed by the CPU core, the arithmetic processing can be executed immediately. Thus, the operating speed of the designed MCU can be increased.

REFERENCE NUMERALS

100: semiconductor device, 101-1: component, 101-2: component, 101-L: component, 102: instruction portion, 103: power supply line, 104: functional circuit, 105: switch, 106: memory portion, 107: memory circuit, 108: memory circuit, 90: memory cell array, 91: word line driver circuit, 92: bit line driver circuit, 93: capacitor, OS1: transistor, OS2: transistor, OS3: transistor, M1: transistor, M2: transistor, MC: memory cell, MC_A: memory cell, MC_B: memory cell, MC_C: memory cell, MC_D: memory cell, MC_E: memory cell, SN: charge retention node, BL: bit line, BL_1: bit line, BL_n: bit line, WL: word line, WL_1: word line, WL_m: word line, BGL: back gate line, RBL: read bit line, RWL: read word line, WBL: write bit line, WWL: write word line, CL: capacitor line, SL: source line, 70: scan flip-flop, 71: selector, 72: flip-flop, 80: data memory circuit, 81: capacitor, OS11: transistor, OS12: transistor, OS13: transistor, FN11: node, PL: terminal, SE: terminal, D: terminal, SD: terminal, CLK: terminal, DF: terminal, QF: terminal, Q: terminal, BK: terminal, RE: terminal, SD_IN: terminal, 110: semiconductor device, CORE: processor core, CORE_REG: register, CORE_MEM: memory, IF1: interface, IF1_REG: register, IF1_MEM: memory, IF2: interface, IF2_REG: register, IF2_MEM: memory, MEM: memory, S11: step, S12: step, S13: step, S14: step, S21: step, S22: step, S23: step, S24: step, 300A: display apparatus, 300B: display apparatus, 10: layer, 20: layer, 30: layer, 60: layer, 11: memory portion, 21: functional circuit, 22: control circuit, 23: display portion driver circuit, 23M: memory circuit, 25: image processing circuit, 25M: memory circuit, 26: sensor circuit, 26M: memory circuit, 27: communication circuit, 27M: memory circuit, 28: input/output circuit, 28M: memory circuit, 29: terminal portion, 31: display portion, 40: sealing substrate, 50: pixel, 51: pixel circuit

The invention claimed is:

1. A display device comprising:

a display portion;

a display portion driver circuit comprising a first memory circuit and a second memory circuit; and an instruction portion, wherein the first memory circuit is configured to store first setting information in a state where power is supplied and the second memory circuit is configured to store the first setting information in a state where power is not supplied, wherein the instruction portion is configured to control whether power is supplied to the display portion driver circuit, wherein the display portion driver circuit is configured to write the first setting information stored in the first memory circuit to the second memory circuit and to be brought into a state where power is not supplied, and is configured to store the first setting information read from the second memory circuit in the first memory circuit and to be brought into a state where power is supplied, and wherein the second memory circuit comprises a transistor comprising a metal oxide in a semiconductor layer where a channel is formed.

2. The display device according to claim 1, wherein the second memory circuit comprises a first transistor and a capacitor, wherein one of a source and a drain of the first transistor is electrically connected to one electrode of the capacitor, wherein the first transistor is configured to be brought into a non-conduction state in a state where power is not supplied, wherein the capacitor is configured to retain charge of the one electrode of the capacitor when the first transistor is brought into a non-conduction state, and wherein the first transistor comprises a metal oxide in a semiconductor layer where a channel is formed.

3. The display device according to claim 1, wherein the second memory circuit comprises a first transistor and a second transistor, wherein one of a source and a drain of the first transistor is electrically connected to a gate of the second transistor, wherein the first transistor is configured to be brought into a non-conduction state in a state where power is not supplied, wherein the second transistor is configured to retain charge of the gate of the second transistor when the first transistor is brought into a non-conduction state, and wherein the first transistor comprises a metal oxide in a semiconductor layer where a channel is formed.

4. The display device according to claim 1, further comprising an image processing circuit comprising a third memory circuit and a fourth memory circuit, wherein the third memory circuit is configured to store second setting information in a state where power is supplied and the fourth memory circuit is configured to store the second setting information in a state where power is not supplied, and wherein the image processing circuit is configured to write the second setting information stored in the third memory circuit to the fourth memory circuit and to be brought into a state where power is not supplied, and is configured to store the second setting information read from the fourth memory circuit in the third memory circuit and to be brought into a state where power is supplied.

5. A semiconductor device comprising:

a processor core comprising a first register and a first memory;

an interface comprising a second register and a second memory; and an instruction portion, wherein the first register is configured to store first setting information in a state where power is supplied and the first memory is configured to store the first setting information in a state where power is not supplied, wherein the second register is configured to store second setting information in a state where power is supplied and the second memory is configured to store the second setting information in a state where power is not supplied, wherein the instruction portion is configured to control whether power is supplied to each of the processor core and the interface, wherein the processor core is configured to write the first setting information stored in the first register to the first memory and to be brought into a state where power is not supplied, and is configured to store the first setting information read from the first memory in the first register and to be brought into a state where power is supplied, wherein the interface is configured to write the second setting information stored in the second register to the second memory and to be brought into a state where power is not supplied, and is configured to store the second setting information read from the second memory in the second register and to be brought into a state where power is supplied, and wherein each of the first memory and the second memory comprises a transistor comprising a metal oxide in a semiconductor layer where a channel is formed.

6. The semiconductor device according to claim 5, wherein each of the first memory and the second memory comprises a first transistor and a capacitor, wherein one of a source and a drain of the first transistor is electrically connected to one electrode of the capacitor, wherein the first transistor is configured to be brought into a non-conduction state in a state where power is not supplied, wherein the capacitor is configured to retain charge of the one electrode of the capacitor when the first transistor is brought into a non-conduction state, and wherein the first transistor comprises a metal oxide in a semiconductor layer where a channel is formed.

7. The semiconductor device according to claim 5, wherein each of the first memory and the second memory comprises a first transistor and a second transistor, wherein one of a source and a drain of the first transistor is electrically connected to a gate of the second transistor, wherein the first transistor is configured to be brought into a non-conduction state in a state where power is not supplied, wherein the second transistor is configured to retain charge of the gate of the second transistor when the first transistor is brought into a non-conduction state, and wherein the first transistor comprises a metal oxide in a semiconductor layer where a channel is formed.

8. A display device comprising:

a display portion;

a display portion driver circuit comprising a first memory circuit and a second memory circuit; and an instruction portion, wherein the first memory circuit is configured to store first setting information in a state where power is supplied and the second memory circuit is configured to store the first setting information in a state where power is not supplied, wherein the instruction portion is configured to control whether power is supplied to the display portion driver circuit, wherein the display portion driver circuit is configured to write the first setting information stored in the first memory circuit to the second memory circuit and to be brought into a state where power is not supplied, and is configured to store the first setting information read from the second memory circuit in the first memory circuit and to be brought into a state where power is supplied, wherein the second memory circuit comprises a transistor comprising a metal oxide in a semiconductor layer where a channel is formed, wherein each of the first memory circuit and the instruction portion is provided in a first layer, and wherein each of the second memory circuit and the display portion is provided in a second layer over the first layer.

9. The display device according to claim 8, wherein the second memory circuit comprises a first transistor and a capacitor, wherein one of a source and a drain of the first transistor is electrically connected to one electrode of the capacitor, wherein the first transistor is configured to be brought into a non-conduction state in a state where power is not supplied, wherein the capacitor is configured to retain charge of the one electrode of the capacitor when the first transistor is brought into a non-conduction state, and wherein the first transistor comprises a metal oxide in a semiconductor layer where a channel is formed.

10. The display device according to claim 8, wherein the second memory circuit comprises a first transistor and a second transistor, wherein one of a source and a drain of the first transistor is electrically connected to a gate of the second transistor, wherein the first transistor is configured to be brought into a non-conduction state in a state where power is not supplied, wherein the second transistor is configured to retain charge of the gate of the second transistor when the first transistor is brought into a non-conduction state, and wherein the first transistor comprises a metal oxide in a semiconductor layer where a channel is formed.

11. The display device according to claim 8, further comprising an image processing circuit comprising a third memory circuit and a fourth memory circuit, wherein the third memory circuit is configured to store second setting information in a state where power is supplied and the fourth memory circuit is configured to store the second setting information in a state where power is not supplied, and wherein the image processing circuit is configured to write the second setting information stored in the third memory circuit to the fourth memory circuit and to be brought into a state where power is not supplied, and is configured to store the second setting information read from the fourth memory circuit in the third memory circuit and to be brought into a state where power is supplied.

* * * * *